US007458059B2

(12) United States Patent
Stirniman et al.

(10) Patent No.: US 7,458,059 B2
(45) Date of Patent: Nov. 25, 2008

(54) MODEL OF SENSITIVITY OF A SIMULATED LAYOUT TO A CHANGE IN ORIGINAL LAYOUT, AND USE OF MODEL IN PROXIMITY CORRECTION

(75) Inventors: John P. Stirniman, Vancouver, WA (US); Micheal D. Cranford, Hillsboro, OR (US)

(73) Assignee: SYNOPSYS, Inc., Mountain View, CA (US)

( * ) Notice: Subject to any disclaimer, the term of this patent is extended or adjusted under 35 U.S.C. 154(b) by 352 days.

(21) Appl. No.: 11/264,298

(22) Filed: Oct. 31, 2005

(65) Prior Publication Data

US 2007/0101310 A1 May 3, 2007

(51) Int. Cl.
*G06F 17/50* (2006.01)
(52) U.S. Cl. ........................................................ 716/21
(58) Field of Classification Search .............. 716/19–21
See application file for complete search history.

(56) References Cited

U.S. PATENT DOCUMENTS

| | | | | |
|---|---|---|---|---|
| 6,081,658 | A | 6/2000 | Rieger et al. | 395/500.22 |
| 6,171,731 | B1 | 1/2001 | Medvedeva et al. | 430/5 |
| 6,263,299 | B1 | 7/2001 | Aleshin et al. | 703/5 |
| 6,289,499 | B1 | 9/2001 | Rieger et al. | 716/21 |
| 2006/0188673 | A1* | 8/2006 | Melvin et al. | 428/34.4 |
| 2006/0190913 | A1* | 8/2006 | Melvin et al. | 716/19 |
| 2006/0190914 | A1* | 8/2006 | Melvin et al. | 716/19 |
| 2007/0250804 | A1* | 10/2007 | Melvin et al. | 716/19 |

OTHER PUBLICATIONS

Stirniman, John P.; Rieger, Michael L., "Optimizing proximity correction for wafer fabrication processes", 14th Annual Bacus Symposium on Photomask Technology and Management Santa Clara, CA, Sep. 14-16, 1994, Proc. SPIE—Int. Soc. Opt. Eng. (USA), vol. 2322, pp. 239-246, 1994.
Stirniman, John P.; Rieger, Michael L; Gleason, Robert, "Quantifying proximity and related effects in advanced wafer processes", Optical/Laser Microlithography VIII; San Jose CA; Feb. 20-22, 1995, Proc. SPIE—Int. Soc. Opt. Eng. (USA), vol. 2322, pp. 252-260, 1995.

(Continued)

*Primary Examiner*—Stacy A Whitmore
(74) *Attorney, Agent, or Firm*—Silicon Valley Patent Group LLP; Omkar Suryadevara

(57) ABSTRACT

A memory is encoded with a model of sensitivity of a distorted layout generated by simulation of a wafer fabrication process, with respect to a change in an original layout that is input to the simulation. The sensitivity model comprises an expression of convolution of the original layout with spatial functions ("kernels") that are identical to kernels of a process model used in the simulation. A difference between the distorted layout and the original layout is computed, and the difference is divided by a sensitivity value which is obtained directly by evaluating the kernel-based sensitivity model, and the result is used to identify a proximity correction (such as serif size or contour movement) to be made to the original layout. Use of a sensitivity model based on a process model's kernels eliminates a second application of the process model to evaluate sensitivity, thereby to reduce memory and computation requirements.

24 Claims, 19 Drawing Sheets

OTHER PUBLICATIONS

Yen, A; Tritchkov, A; Stirniman, J; Vandenberghe, G; Jonckheere, R; Ronse, K; Van den hove, L, "Characterization and correction of optical proximity effects in deep-ultraviolet lithography using behavior modeling", American Vacuum Society; Microelectronics and Nanometer Structures, Vac. Sci, Technol. B 14(6), pp. 4175-4178, Nov./Dec. 1996.

Stirniman, John P.; Rieger, Michael L., "Spatial filter models to describe IC lithographic behavior", Optical Microlithography X; San Jose CA; Mar. 12-14, 1997, Proc. SPIE—Int. Soc. Opt. Eng. (USA), vol. 3051, pp. 469-478, 1997.

Tritchkov, A.; Rieger, M.; Stirniman, J.; Yen, A.; Ronse, K.; Vandenberghe, G.; Van den hove, L., "Optical proximity effects correction at 0.25 um incorporating process variations in lithography", Optical/Laser Microlithography X; San Jose CA; Mar. 12-14, 1997, Proc. SPIE—Int. Soc. Opt. Eng. (USA), vol. 3051, pp. 726-738, 1997.

Tritchkov, A; Stirniman, J; Gangala, H; Ronse, K, "0.18 um KrF lithography using OPC based on empirical behavior modeling", American Vacuum Society; Microelectronics and Nanometer Structures, Publication: J. Vac. Sci. Technol. B 14(6), pp. 3398-3404, Nov./Dec. 1998.

Kurt Ronse, Alexander Tritchkov, John Randall, "Automated OPC application in advanced lithography", Bacus PhotoMask Japan Symposium, Kanagawa, Apr. 1997.

Yuri Granik, Nick Cobb, Thuy Do, "Universal Process Modeling with FTRE for OPC", Optical Lithography XV, Proceedings SPIE vol. 4691, pp. 377-394, 2002.

Yuri Granik, Nick Cobb, "New Process Models for OPC at sub-90nm Nodes", Optical Lithography XVI, Proceedings SPIE vol. 5040, pp. 1166-1175, 2003.

S.F. Schulze, O. Park, R. Zimmermann, et al., "Model-based OPC considering process window aspects: a study" Optical Lithography XV, vol. 4691, pp. 1097-1105, 2002.

Y Pati, T Kailath, "Phase shifting masks for microlithography, automated design and mask requirements", Journal of the Optical Society of America, Optics Image Science and Vision, 11 No. 9: pp. 2438-2452, 1994.

N. Cobb, A. Zakhor, "Fast Sparse Aerial Image Calculation for OPC", Bacus 1994, SPIE vol. 2621, pp. 534-545, 1995.

Nick Cobb, Avideh Zakhor, Eugene Miloslavsky, "Mathematical and CAD framework for Proximity Correction", SPIE, vol. 2726, pp. 208-222, section 3, 1996).

H Liao, S Palmer, K Sadra, "Variable Threshold Optical Proximity Correction (OPC) Models for High Performance 0.18um Process", SPIE, vol. 4000, pp. 1033-1040, 2000.

J Randall, K Ronse, T Marschner, M Goethals, M Ercken, "Variable Threshold Resist Models of Lithography Simulation", SPIE 3679, pp. 176-182, 1999.

Yuri Granik "Solving Inverse Problems of Optical Microlithography" published Mar. 2005 in the Proceedings of SPIE vol. #5754-47.

Nicolas Bailey Cobb, "Fast Optical and Process Proximity Correction Algorithms for Integrated Circuit Manufacturing", A dissertation submitted in partial satisfaction of the requirements for the degree of Doctor of Philosophy in Engineering: Electrical Engineering and Computer Science in the Graduate Division of the University of California at Berkeley, Abstract, Spring 1998, pp. 1-123.

Wong, A.K. et al. "The mask error factor in optical lithography", IEEE Transactions on Semiconductor Manufacturing, vol. 13, Issue 2, May 2000, pp. 235-242.

Terasawa, T. et al. "Theoretical MEF calculation for periodic patterns", International Microprocesses and Nanotechnology Conference, Jul. 2000, pp. 16-17.

Press, W. "Numerical Recipes in C", Cambridge University Press, 2002, p. 521-525.

* cited by examiner

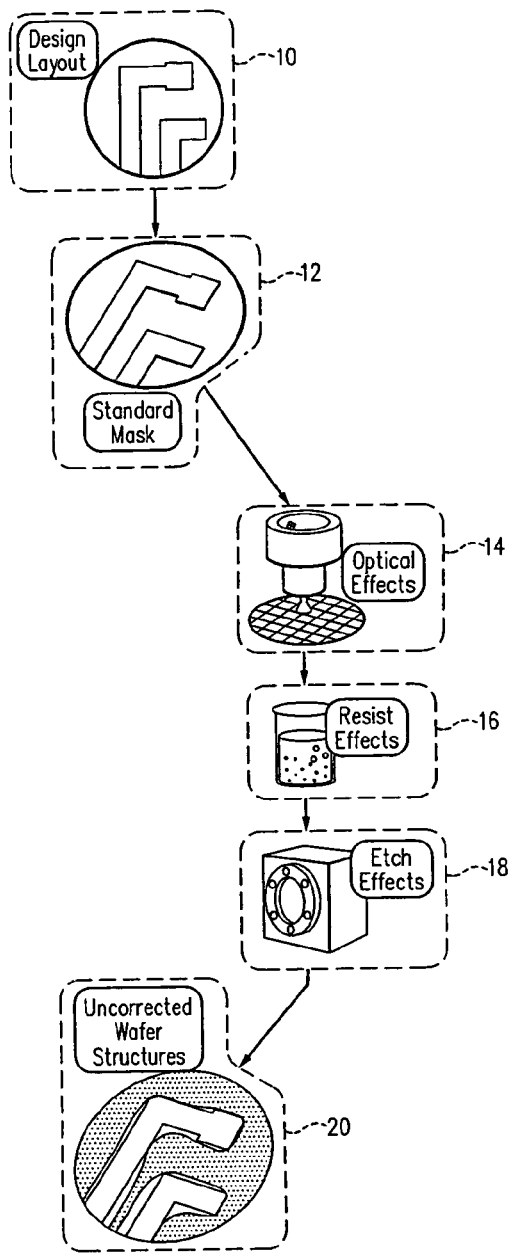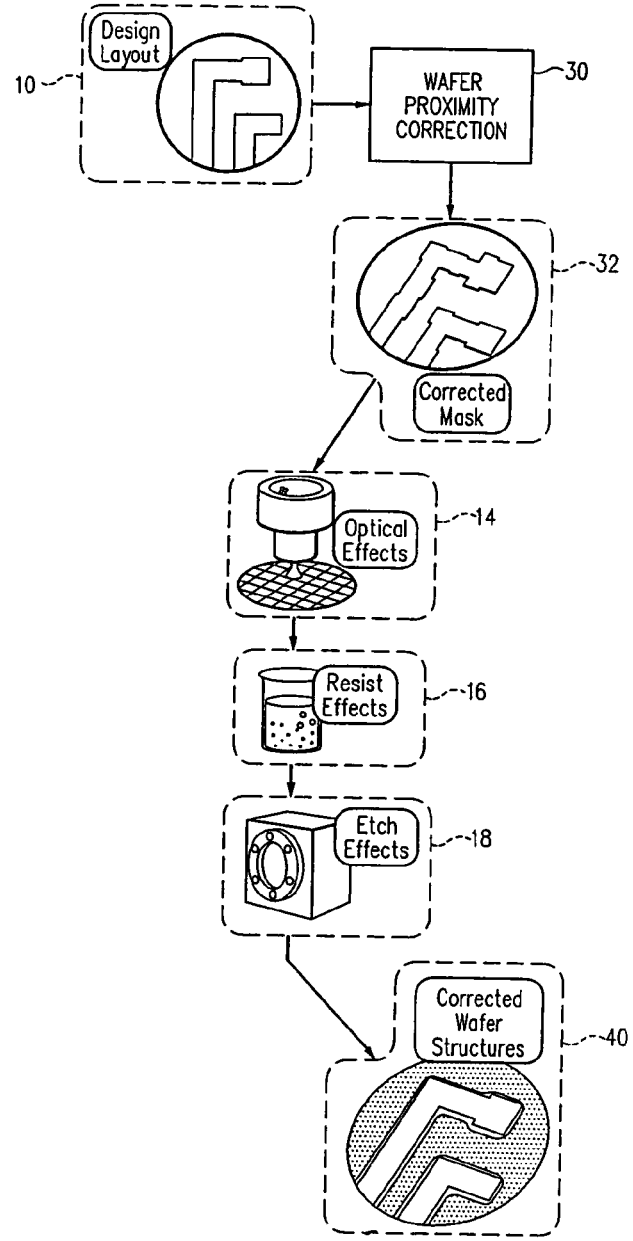
FIG. 1A
(prior art)
FIG. 1B
(prior art)

MODEL OF SENSITIVITY OF A SIMULATED LAYOUT TO A CHANGE IN ORIGINAL LAYOUT, AND USE OF MODEL IN PROXIMITY CORRECTION

BACKGROUND

1. Field of the Invention

The invention relates to design of layouts used in lithography of semiconductor wafers. More specifically, the invention relates to a method and an apparatus for applying proximity corrections to layouts of integrated circuit (IC) chips.

2. Related Art

In the manufacture of integrated circuit (IC) chips, minimum feature sizes have been shrinking according to Moore's law. Currently the minimum feature size is smaller than the wavelength of light used in the optical imaging system. In order to achieve reasonable fidelity (including resolution and depth of focus) between (a) a layout designed in a computer and (b) shapes of circuit elements formed in a wafer after fabrication, a number of reticle enhancement technologies (RET) have been developed over the last decade, such as optical proximity correction (OPC), phase shifting masks (PSM), and sub-resolution assist features.

Proximity correction as performed in prior art, is briefly described below. First an originally-drawn shape called layout (or pattern) 10 is created in a computer (see FIG. 1A) by use of electronic design automation (EDA) software available from, for example, Synopsys, Inc. Then layout 10 is etched into a standard mask 12. Mask 12 is then used to form a wafer, using a lithography process during which pattern 10 is subject to optical effects 14, resist effects 16, and etch effects 18. The result is an uncorrected wafer structure 20 (FIG. 1A) which contains a number of deviations from layout 10.

One or more such differences between structure 20 and original layout 10 may be measured and used to identify wafer proximity corrections 30 (FIG. 1B). Wafer proximity corrections 30 are then used to overcome this specific set of optical effects 14, resist effects 16, and etch effects 18 when using layout 10 to form a wafer. Specifically, as shown in FIG. 1B, layout 10 is subjected to wafer proximity corrections 30 to form a corrected mask 32. Use of corrected mask 32 in lithography results in a corrected wafer structure 40 with significantly fewer deviations from pattern 10.

Wafer proximity corrections 30 may be obtained, by overlaying on original layout 10, a number of predetermined shapes called "serifs". These serifs may add or remove area from the layout. FIGS. 1C and 1D illustrate a portion of an original layout 81 (FIG. 1C) and an adjusted version thereof obtained by addition of square shaped serifs 83-89 (FIG. 1D). Although serifs 83-89 are illustrated as square in shape, other shapes such as rectangles or long lines of effectively infinite length and finite width may be used. The size of each of serifs 83-89 is selected depending on a specific amount of deviation at individual x-y locations in structure 20 (FIG. 1A) relative to corresponding locations in original layout 10.

Wafer proximity corrections 30 may be obtained by forming, in a computer, a model of a wafer fabrication process ("process model") using one or more convolution kernels to simulate the wafer image distribution that results from a lithography process. The term "intensity" is sometimes used to denote wafer image distribution resulting from a combination of optical effects 14, resist effects 16, and etch effects 18 of a semiconductor wafer fabrication process to create a layer in the wafer, for example, a metal layer or a polysilicon layer. Such a distribution is typically generated from a kernel-based model of the fabrication process (including each of optical effects 14, resist effects 16, and etch effects 18), by convolving an IC layout with convolution kernels to obtain a simulated wafer image. Convolution kernels used in prior art, to model a wafer fabrication process, are shown in FIGS. 1F-1O.

The specific convolution kernels that are used in a process model are normally identified by a supplier of the model. The supplier may generate the process model by empirically fitting data from test wafers using any conventional software such as Progen™, a lithography model development tool available from Synopsys, Inc. or Calibre™ available from Mentor Graphics, Inc.

A process model typically contains a set of spatial filtering kernels (FIGS. 1F-1O), where the 2 dimensional kernel surface is defined as an algebraic expression, or as numerical values on a grid of 2-D points. Each of these kernels will be convolved against an IC mask layer. The mask layer is a 2-dimensional surface defined by polygons where the value of the surface inside the polygon is 1, and 0 outside the polygon (or vice versa for a clear field mask). The process model also contains one or more algebraic expression(s) describing how to combine the convolution results into an intensity surface. The process model also contains an algebraic expression (typically a constant) describing a threshold value for drawing contours in the process intensity surface.

For more information on making and using process models, see the following articles all of which are incorporated by reference herein in their entirety as background:

Title: Optimizing proximity correction for wafer fabrication processes.
Author: Stirniman, John P.; Rieger, Michael L.
Conference: 14th Annual Bacus Symposium on Photomask Technology and Management Santa Clara, Calif., Sep. 14-16, 1994.
Publication: Proc. SPIE—Int. Soc. Opt. Eng. (USA), vol 2322, p. 239, 1994

Title: Quantifying proximity and related effects in advanced wafer processes.
Author: Stirniman, John P.; Rieger, Michael L; Gleason, Robert.
Conference: Optical/Laser Microlithography VIII; San Jose Calif.; Feb. 20-22, 1995
Publication: Proc. SPIE—Int. Soc. Opt. Eng. (USA), vol. 2322, p. 252, 1995

Title: Characterization and correction of optical proximity effects in deep-ultraviolet lithography using behavior modeling.
Author: Yen, A; Tritchkov, A; Stirniman, J; Vandenberghe, G; Jonckheere, R; Ronse, K; Van den hove, L;
Conference: American Vacuum Society; Microelectronics and Nanometer Structures
Publication: J. Vac. Sci. Technol. B 14(6), p. 4175 November/December 1996

Title: Spatial filter models to describe IC lithographic behavior
Author: Stirniman, John P.; Rieger, Michael L.
Conference: Optical Microlithography X; San Jose Calif.; Mar. 12-14, 1997
Publication: Proc. SPIE—Int. Soc. Opt. Eng. (USA), vol 3051, p. 469, 1997

Title: Optical proximity effects correction at 0.25 um incorporating process variations in lithography.
Author: Tritchkov, A.; Rieger, M.; Stirniman, J.; Yen, A.; Ronse, K.; Vandenberghe, G.; Van den hove, L.
Conference: Optical/Laser Microlithography X; San Jose Calif.; Mar. 12-14, 1997
Publication: Proc. SPIE—Int. Soc. Opt. Eng. (USA), vol 3051, p. 726, 1997

Title: 0.18 um KrF lithography using OPC based on empirical behavior modeling.
Author: Tritchkov, A; Stirniman, J; Gangala, H; Ronse, K
Conference: American Vacuum Society; Microelectronics and Nanometer Structures
Publication: J. Vac. Sci. Technol. B 14(6), p. 3398 November/December 1998
Title: Automated OPC application in advanced lithography
Author: Kurt Ronse, Alexander Tritchkov, John Randall,
Conference: Bacus PhotoMask Japan Symposium, Kanagawa, April 1997
Title: Universal Process Modeling with FTRE for OPC,
Author: Yuri Granik, Nick Cobb, Thuy Do,
Conference: Optical Lithography XV, Proceedings SPIE Vol. 4691, 2002.
Title: New Process Models for OPC at sub-90 nm Nodes,
Author: Yuri Granik, Nick Cobb,
Conference: Optical Lithography XVI, Proceedings SPIE Vol, 5040, 2003
Title: Model-based OPC considering process window aspects: a study,
Author: S. F. Schulze, O. Park, R. Zimmermann, et al.,
Conference: Optical Lithography XV, Vol 4691, 2002

Explicit descriptions of the process model expressions that are conventionally used to combine convolution values at a given location in a layout, to generate an intensity value at that location, are provided in a number of prior art publications, such as the following articles all of which are incorporated by reference herein in their entirety as background:

Y Pati, T Kailath, Phase shifting masks for microlithography, automated design and mask requirements, Journal of the Optical Society of America, Optics Image Science and Vision, 11 No9:2438-2452, 1994;

N. Cobb, A. Zakhor, Fast Sparse Aerial Image Calculation for OPC, Bacus 1994, SPIE Vol 2621, p534-545, 1995;

Mathematical and CAD framework for Proximity Correction, Nick Cobb, Avideh Zakhor, Eugene Miloslavsky, SPIE, Vol 2726, p208-222, section 3, 1996);

H Liao, S Palmer, K Sadra, "Variable Threshold Optical Proximity Correction (OPC) Models for High Performance 0.18 um Process, SPIE, Vol 4000, p 1033-1040, 2000; and J Randall, K Ronse, T Marschner, M Goethals, M Ercken, "Variable Threshold Resist Models of Lithography Simulation, SPIE 3679, p 176-182, 1999.

Prior art methods of proximity correction involve a first application of a process model to an unperturbed layout, to obtain an unperturbed intensity surface (or value at a point) which represents the wafer's image distribution as a function of location (x, y) (or at a single point). Thereafter, the layout is perturbed by adding or removing a serif of an initial serif size, followed by a re-application (i.e. a second application) of the process model to the perturbed layout to obtain a perturbed intensity surface or a perturbed intensity value at a point. The initial serif size, when scaled by a ratio of (a) a difference between a threshold and unperturbed intensity and (b) a difference between the perturbed intensity and the unperturbed intensity, yields a serif size used in proximity correction. In current commercial tools known to this inventor, the second application of the process model is performed iteratively, until the individual serif is properly sized to within a predefined tolerance.

The just-described second application of the process model is typically performed 1000s of times, once for each location (x, y) where one wishes to place a serif In the end, when the original layout has been adjusted at sufficient locations, a simulated wafer image (from using all the proximity corrections) conforms to the original (unadjusted) layout sufficiently to proceed to actual fabrication of production wafers.

Note that a second application of the process model is required for every serif, because current prior art known to this inventor does not teach how to separately account for the individual intensity contribution from an individual serif. Such an individual contribution cannot be simply added to an earlier computed intensity when the process model is non-linear. In practice, process models are at least $2^{nd}$ order non-linear, as both optical energy and optical coherence effects are second order. The prior art known to this inventor always re-evaluates the process model after every perturbation in the layout shape. This inventor notes that the two applications of the process model, once without the serif, and a second evaluation with the serif, are providing a numerical response of the process model intensity with respect to the serif, without modeling sensitivity as described herein by this inventor, after this background section.

After proximity corrections are identified as described above, a corrected mask is created using a proximity corrected layout (see step 48 in FIG. 1E), followed by use of the corrected mask, in lithography and related wafer fabrication processes (see step 42"), to produce a production wafer 40' having the corrected layout (i.e. this layout sufficiently conforms to the originally-designed unadjusted layout). As shown in FIG. 1E, a test wafer 20' may be initially used to formulate a correction recipe 44 that is stored in a recipe library 46 for use in proximity correction 30 of new IC designs 10".

In the process described in paragraph [0008], the most compute intensive work is performed in applying a process model to a layout, which as noted above requires a second application of the process model for each serif U.S. Pat. Nos. 6,081,658 and 6,289,499 that are incorporated by reference herein in their entirety, describe fast convolution methods for calculating intensity at a single location. These methods can be used to apply a process model to a layout as often as needed, and they operate in the space domain. All commercial full-chip proximity correction tools known to this inventor use this space domain, fast convolution method for process model evaluation. To calculate the effect of a perturbation, these tools rely on two calls to the process model—one without the serif and a second with the serif. When using the fast convolution method, the second application of the process model is fast enough to make full-chip proximity correction tools practical Application of a process model to a layout for proximity correction can also be performed in the frequency domain using any conventional FFT (fast Fourier transform), to transform the layout into the frequency domain where the convolutions are calculated. See, for example, U.S. Pat. No. 6,263,299 granted to Aleshin, et al. and U.S. Pat. No. 6,171,731 granted to Medvedeva, et al. both of which are incorporated by reference herein in their entirety, as background. Note that these two patents also require the second application of the process model, within the loop over each location where a serif is to be added, as described above in paragraph [0015].

When using the method of FFT to calculate convolutions in a process model, the second application of the process model at each serif is prohibitively expensive. There is currently no known method, to the knowledge of this inventor, to calculate the effect of a perturbation on the process model, without calculating the effect of the perturbation on each of the individual FFT's used in the process model. Because there may be between 4 to 40 separate FFT's used in the application of the process model, calculating the effect of the perturbation on each is cumbersome. Also, to the knowledge of this inventor, an FFT approach is currently not used in any commercially available software for full chip, optical proximity correction, in part because of the inability to calculate the effect of a perturbation quickly.

An article by Yuri Granik published March 2005 in the Proceedings of SPIE Vol. #5754-47, entitled "Solving Inverse Problems of Optical Microlithography" describes a method to calculate the effect of a perturbation in the layout, when using an FFT-based method for the calculation of intensity. Towards the end of this article, in section 5 thereof, Granik suggests that saving electrical fields $A_i^0$ for a mask $m^0$ and calculating the intensity for a slightly different mask m' as per equation (61) based on the saved fields $A_i^0$, is faster than a second convolution of the perturbed layout by FFT. The convolutions in equation (61) are quickly calculated by direct multiplication, according to Granik. Therefore, Granik calculates the effect of each perturbation on each saved electric field, then applies the process model a second time to calculate a perturbed intensity. Granik's perturbed intensity, the original intensity, and a target intensity are used to calculate a serif size, using the same serif size calculation currently used in commercial tools as described in paragraph [0011].

In Granik's method, computational complexity may be reduced to order (d*M*N), where d is the number of pixels modified in the pattern, M is the number of pixels in the kernel and is typically on order of two-hundred-fifty to twenty thousand, and N is the number of intermediate electric fields and is typically on order of four to forty. Granik states the particular importance of the case where one perturbs a pattern one pixel at a time, where d=1. However, even when d=1, the number of calculations necessary per perturbation is on order of one thousand to one million. Hence, Granik's method appears to be too slow for practical applications.

Furthermore, caching intermediate FFT results requires memory. If an IC design has been divided up into a number of subdivisions of area 100 by 100 micron$^2$, with pixel resolution of 50 nanometers, then each subdivision requires roughly 32M Bytes per FFT. And this value easily grows by another order of magnitude, by increasing the area of the FFT or the decreasing the pixel size. Assuming between 4-40 FFT's in a typical application, this results in 100M to 1.2 G Bytes of cached information in Granik's method, a size far too large to be accessed quickly using cache technologies available in today's computers.

In the above-discussed article, Granik applies the process model a second time for each serif. Although he has proposed a faster method to evaluate the effect of the serif, his calculation still relies on a numerically calculated response, which can be easily identified by his two applications of the process model, with and without a serif. Since the process model in practical applications is non-linear, the second call to the process model at each serif is computationally expensive. In this regard, Granik's method is consistent with current commercial tools which apply the process model a second time at each serif. Granik fails to disclose or suggest a second model of sensitivity, as described herein by this inventor, in text following this background section.

Granik's method also requires saving the intermediate electric fields. This is another indication that he is calculating a numerical response, as the second application of the process model requires these intermediate electric fields. In the method discussed next, it is not necessary to save (or regenerate) the intermediate electric fields, and hence, not possible to calculate the process model a second time.

It is well known in the prior art to compute a parameter called "mask error factor" (MEF) as the change in an imaged edge position per unit change in the corresponding drawn edge position. In the language of OPC, this inventor postulates a MEF equivalent to be the "change in process model contour position per unit change in perturbation width". Prior art known to the inventor calculates MEF numerically, by calling the process model twice as noted above: once without the perturbation, once with the perturbation. Thereafter, the two corresponding contours are calculated, followed by taking the difference, and calculate the MEF as the change in the contour difference divided by the size of the perturbation. To the knowledge of this inventor, there is no prior art method to derive an algebraic MEF sensitivity function which defines the MEF at any arbitrary polygon edge.

SUMMARY

A memory in accordance with the invention is encoded with a model of sensitivity of a layout, where the layout ("distorted layout") is generated by simulation of a wafer fabrication process on an original layout, and a computer when appropriately programmed with the sensitivity model, simulates the change in the distorted layout with respect to a change in the original layout. The sensitivity model comprises an expression of convolution of the original layout with spatial functions ("kernels") that are identical to kernels of another model, namely a model of a wafer fabrication process (hereinafter "process model"). The process model is used in the simulation to generate the distorted layout. A single difference, between the distorted layout and the original layout is computed, and the difference is divided by a sensitivity value which is obtained directly from the sensitivity model. The result of the division is used to identify a proximity correction (such as serif size or edge movement) to be made to the original layout.

The prior art second application of the process model at each serif is eliminated in many embodiments of the invention, by use of the sensitivity model. In several embodiments, identifying the effect of each serif on the distorted layout requires an evaluation of the sensitivity model. Such embodiments are superior over the prior art's double application of the process model for three reasons. First, the sensitivity model is based on the process model's kernels and corresponding unperturbed convolution results. There is no need to re-calculate the effect of the perturbation on each of the individual convolution surfaces used in the process model. Second, in the typical case where the process model is $2^{nd}$ order (non-linear), the sensitivity model is $1^{st}$ order (linear). This linear model is easier to compute as compared to the non-linear model. Third, since it is not necessary to re-calculate perturbed convolution results, it is not a requirement that one save, modify, or regenerate the intermediate convolution results for each serif (at each (x,y) location), thereby reducing memory requirements.

The methods, data structures, systems and combinations thereof described herein for creating and using a sensitivity model may be extended, in some embodiments, to model a measure of sensitivity commonly known in the art as mask error factor ("MEF"). A MEF model is determined, in some embodiments, in a manner similar or identical to a sensitivity model as described herein. Such a MEF model is further used, in several embodiments, to directly calculate the sizes of serifs from errors in the distorted layout's contours.

Depending on the embodiment, the sensitivity model is used regardless of whether the process model is evaluated using a fast-convolution approach, or an FFT approach. However, the computational benefit from eliminating the second application of the process model at each serif is most apparent in embodiments using the FFT approach to calculate the process model.

In numerous embodiments, the sensitivity model is used independent of how it is created and vice versa, although some embodiments combine a specific creation method with a specific usage method of the type described herein.

BRIEF DESCRIPTION OF THE FIGURES

FIG. 1A is a flow chart of a prior art creation of an uncorrected wafer using a standard mask.

FIG. 1B is a flow chart of a prior art creation of a corrected wafer using a mask corrected by wafer proximity correction.

DETAILED DESCRIPTION

A memory 210 (FIG. 2) of a computer is encoded, in accordance with the invention, with a model 212 of sensitivity of a layout generated by simulation of fabrication of a wafer (hereinafter "distorted layout"), with respect to a change in an original layout of an integrated circuit (IC) chip that is input to the simulation. The change in original layout may be in any form, such as a serif of unit area or a movement of a polygon edge in the layout by a unit distance. During simulation, the computer evaluates another model, namely a model 211 of a wafer fabrication process (hereinafter "process model") to generate the distorted layout. A sensitivity model 212 can be created from the process model 211 in any manner, either manually or automatically, and creation of model 212 (as per operation 201 in FIG. 2) in certain illustrative embodiments is described below.

Figure 1C:
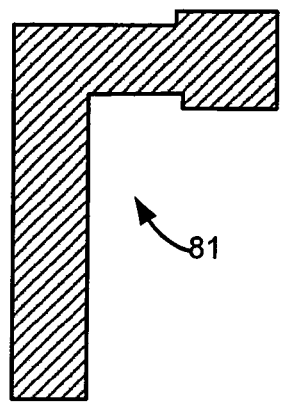
FIG. 1C shows a prior art shape in a layout of an integrated circuit (IC) chip.
Figure 1D:
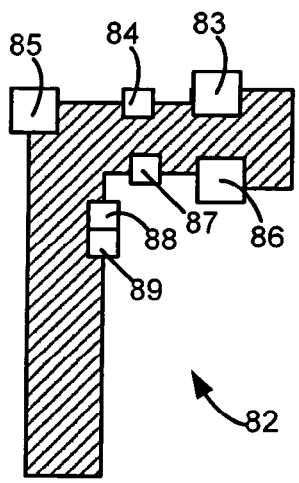
FIG. 1D shows the shape of FIG. 1C, overlaid with square-shaped serifs used in a proximity correction technique of the prior art.
Figure 1E:
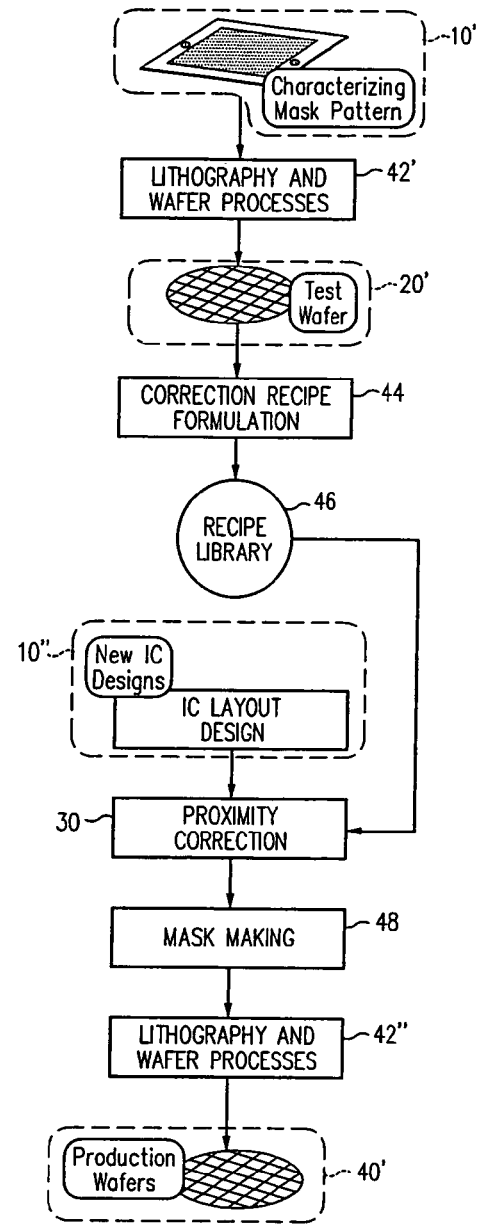
FIG. 1E is a flow chart of a prior art process for forming and use of a recipe library.

Distorted layout 231 generated by use of process model 211 includes optical effects 14, resist effects 16, and etch effects 18 (as described above, in reference to FIG. 1A) after performance of a semiconductor wafer fabrication process to create a layer in a wafer, such as a metal layer or a polysilicon layer. Process model 211 is similar or identical to any process model in the prior art, and a specific expression 211E used therein may be either known or unknown, depending on the embodiment.

Sensitivity model 212 contains, in many embodiments of the invention, an expression 212E of convolution of original layout 262 with one or more functions (called "kernels") 261 that form the basis of process model 211. Hence, sensitivity model 212's expression 212E of many embodiments, uses a subset of the kernels 261 that are required for process model 211's expression 211E. An expression typically includes a form and a set of coefficients, typically one coefficient for each term in the form. The form includes the number of terms in the expression, the kernel(s) associated with each term, the order of the term (e.g linear, squared, cubic ) and the type and order of arithmetic operations to be performed on each term (e.g add, divide). A common form for process model 211's expression 211E is four to forty terms, each term using the convolution result of a single kernel, where the arithmetic operation is to square each term and sum the result (a 'sum of squares'). Several embodiments of the invention use in sensitivity model 212 an expression 212E that has between one to five terms, each term using the convolution result of a single kernel, where the arithmetic operation is the linear sum of terms.

A memory 210 encoded with a kernel-based sensitivity model 212 ensures that a single set of kernels 261 is used in both models 211 and 212. Use of the sensitivity model 212 provides significant improvements in computation speed and memory utilization, when used to identify proximity corrections to an original layout, as compared to methods that apply the process model a second time. As noted above in the Background section, application of the process model is computationally expensive, especially when applied the second time, in a loop.

A sensitivity model 212 that uses kernels 261 as discussed in paragraph [0049] can be created by assuming and using (directly or indirectly) a derivative relationship of the sensitivity model 212 to the process model 211. The derivative relationship may be used directly, e.g. if the process model is completely known then a mathematical differentiation operation is performed thereon, either manually or automatically depending on the embodiment. The derivative relationship is used indirectly in some embodiments if the process model 211 is only partially known, e.g. if the process model 211 is known to be of order M and uses a group of predetermined kernels, then a sensitivity model 212 is created by empirically fitting a set of observed sensitivity measurements from a test wafer to an expression of a next lower order i.e. order M−1 that also uses the predetermined kernels. If order M is not known, it is determined empirically.

In some embodiments, a mathematical derivative (or approximation to a mathematical derivative) of an expression 211E in process model 211 or an adjusted version thereof is stored in memory 210 as the sensitivity model's expression 212E. Hence, in the just-described embodiments, evaluation of sensitivity model 212 has one order less computational complexity than the complexity in evaluating its corresponding process model 211. In a first example of such embodiments, if process model 211's expression 211E is a sum of squares e.g. $c1A^2+c2B^2+c3C^2 \ldots$ wherein c1, c2, c3 are constants and A, B and C are convolutions of kernels 261 with layout 262, then its mathematical derivative namely $2*(c1A+c2B+c3C+\ldots)$ is stored in memory 210 of some embodiments, as the sensitivity model's expression 212E. In a second example, if the process model's expression 211E is written as any general algebraic expression, then its algebraic derivative is determined and is stored in memory 210 of some embodiments, as expression 212E of sensitivity model 262.

Instead of storing in memory 210 a strict mathematical derivative as expression 212E as discussed in paragraph [0052], an approximation is stored in some variants of the discussed embodiments. For example, some embodiments approximate a mathematical derivative of model expression 211E, by a Taylor series that is stored as sensitivity expression 212E. Moreover, some embodiments use an adjusted sensitivity expression 212E or an approximation thereto, to account for the effect of large sized serifs, e.g. by adding terms to expression 212E which account for higher order derivatives of process model expression 211E, and make the sensitivity expression dependent on the serif's size. Other embodiments to make other such adjustments (either manually or automatically) will be apparent to the skilled artisan in view of this patent application.

In making adjustments, one or more terms may be excluded from expression 212E in some embodiments. For example, manual or automatic inspection of a mathematical derivative (which may itself be generated manually or automatically), may reveal that certain coefficients are so small that during evaluation of expression 212E they result in terms whose contribution is negligible. A term's contribution may be determined (manually or by computer) to be negligible, if an error in proximity correction from dropping the term is less than a predetermined limit (set by a human). Hence, if a term's contribution is negligible and at the same time computational complexity in evaluating the term is sufficiently high, it may be worthwhile to drop the terms from sensitivity expression 212E.

In one illustrative example of such approximation, two checks are made to see (1) if a first coefficient is an order of magnitude smaller than a second coefficient (which two coefficients are taken from the top of sorted list obtained by sorting all coefficients in ascending order) and (2) if the first coefficient's multiplicand is of a higher degree than the second coefficient's multiplicand, and if both answers are true then a term in the derivative of expression 211E which contains the first coefficient is dropped thereby to identify the sensitivity expression 212E. The just-described approximation technique can be implemented manually or automatically or in a combination thereof, depending on the embodiment. In a combination technique, a computer may be programmed to automatically identify one or more terms for dropping from an automatically generated derivative, followed by display of the identified terms to a human and dropping of the term(s) on receipt of manual approval, thereby to implement the approximation.

Still other embodiments store in memory 210 a linear expression (e.g. $c1A+c2B+c3C+\ldots$) as expression 212E of sensitivity model 212, without regard to (and independent of) a specific form of the expression 211E in the corresponding process model 211, although in these embodiments as well both models 211 and 212 use the same kernels 261. Therefore, regardless of the embodiment, a computer memory 210 in accordance with the invention is encoded with a unique combination of two different models 211 and 212 that both use a common set of kernels 261, whereby one model (sensitivity model 212) when evaluated provides sensitivity of a distorted layout output by the other model (process model 211), relative to changes in an original layout input to the other model (process model 211).

A sensitivity model 212, of the type described in paragraph [0049] which is based on kernels 261 that are also the basis of process model 211, is used in accordance with the invention to reduce or eliminate the number of times compute-intensive acts are repeatedly performed. Specifically, some embodiments perform a convolution of an original layout 262 with each of the N kernels 261 only once in stage 221, regardless of the number of locations at which proximity corrections are to be made. The convolutions in stage 221 may be performed in any manner well known in the art. Subsection A in paragraph [0134] describes some industry-standard methods that are used in some embodiments to evaluate a process model in stage 221 and 222. Stage 221 generates as output N two dimensional (2-D) arrays of convolution values, for locations on a grid superposed on the layout, one array for each kernel. The 2-D arrays are also referred to herein as convolution surfaces. Stage 221 supplies the N convolution surfaces to stage 223 in all embodiments of FIG. 2, and also optionally supplies them to stage 222 in embodiments that evaluate a known expression in stage 222, as further described below in reference to FIG. 3A.

In embodiments wherein process model 211 has a known expression, the N surfaces which result from convolution with N kernels are supplied from stage 221 to each of stages 222 and 223 for evaluation of the respective model expressions 211E and 212E. An inter-relationship between these three stages in FIG. 2 is shown customized for such embodiments in FIG. 3A, and described further below.

Figure 3A:
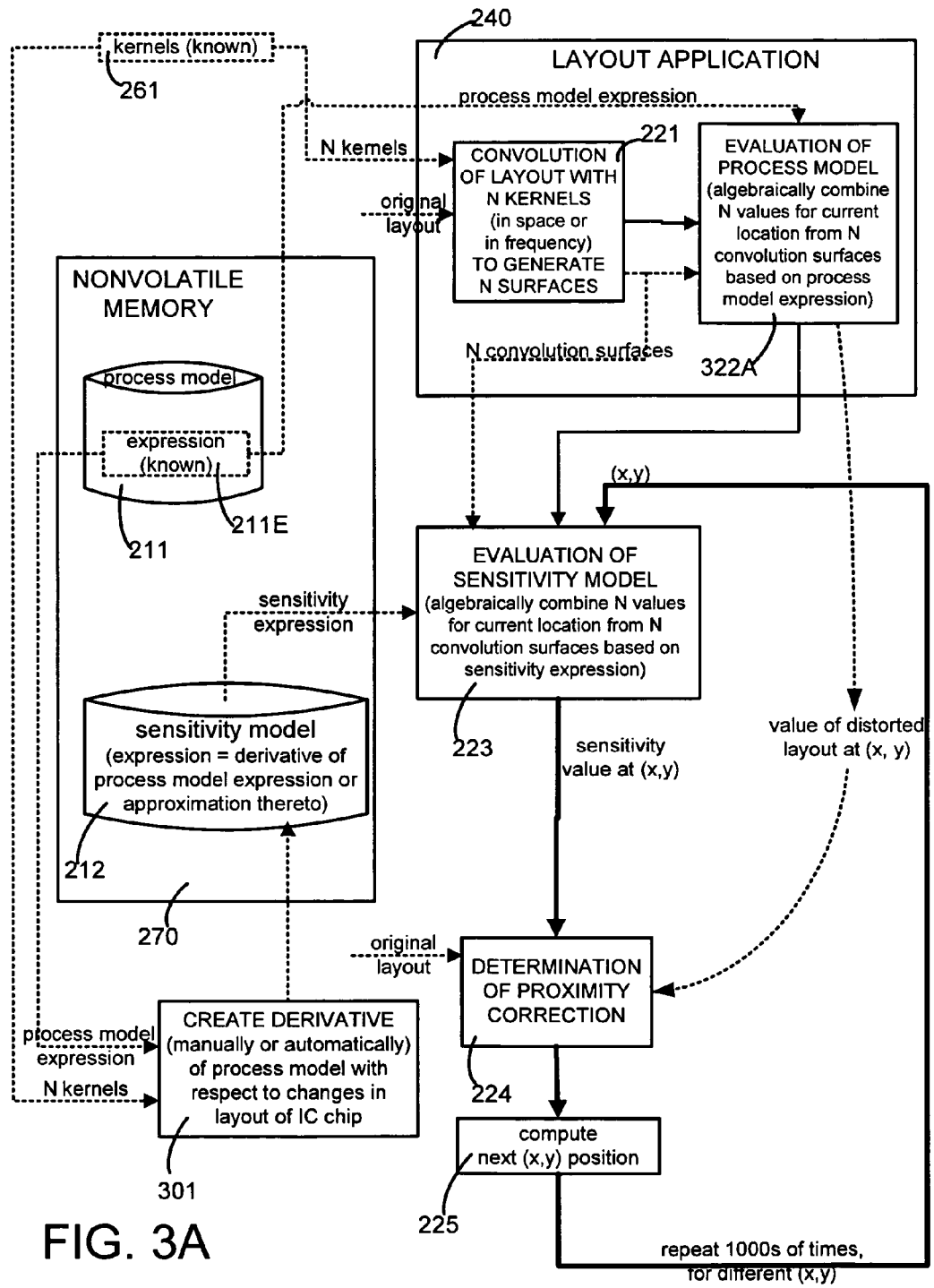
FIGS. 3A and 3B illustrate two embodiments of the type illustrated in FIG. 2, for use of a sensitivity model with a process model that contains a known expression and unknown expression respectively.
Figure 3B:
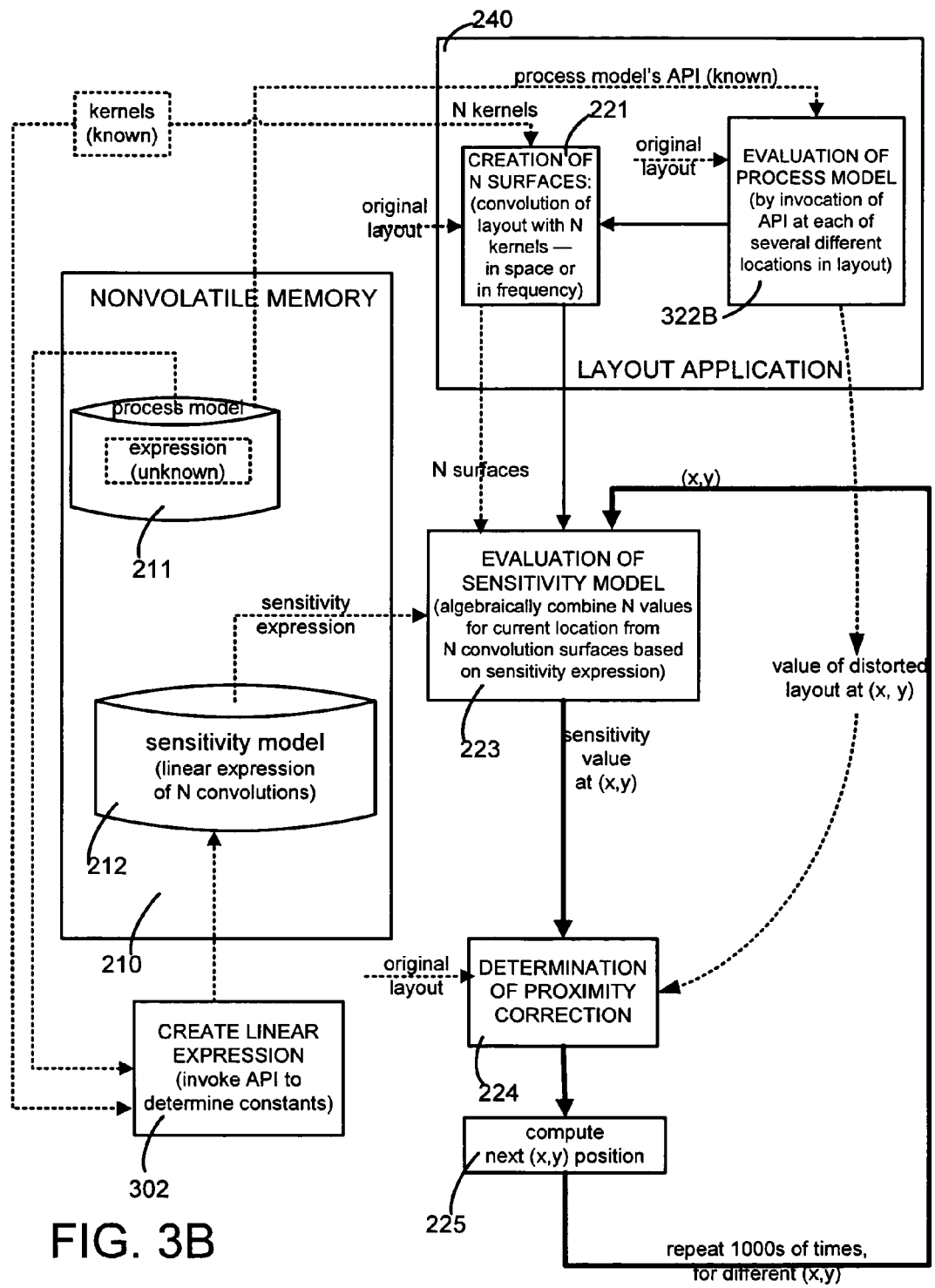

In embodiments wherein process model 211 has an unknown expression, the N surfaces are supplied from convolution stage 221 to only one evaluation stage, namely stage 223 for evaluation of sensitivity model 212, as shown and described in reference to FIG. 3B. In these embodiments, evaluation of the process model in stage 222 is performed by invoking a library fiction, a macro call, or other such application programming interface (API) that may or may not internally perform convolutions, and may or may not access the convolution surfaces generated in 221, and such internal performance is not known (and not under the control) of these embodiments.

Figure 2:
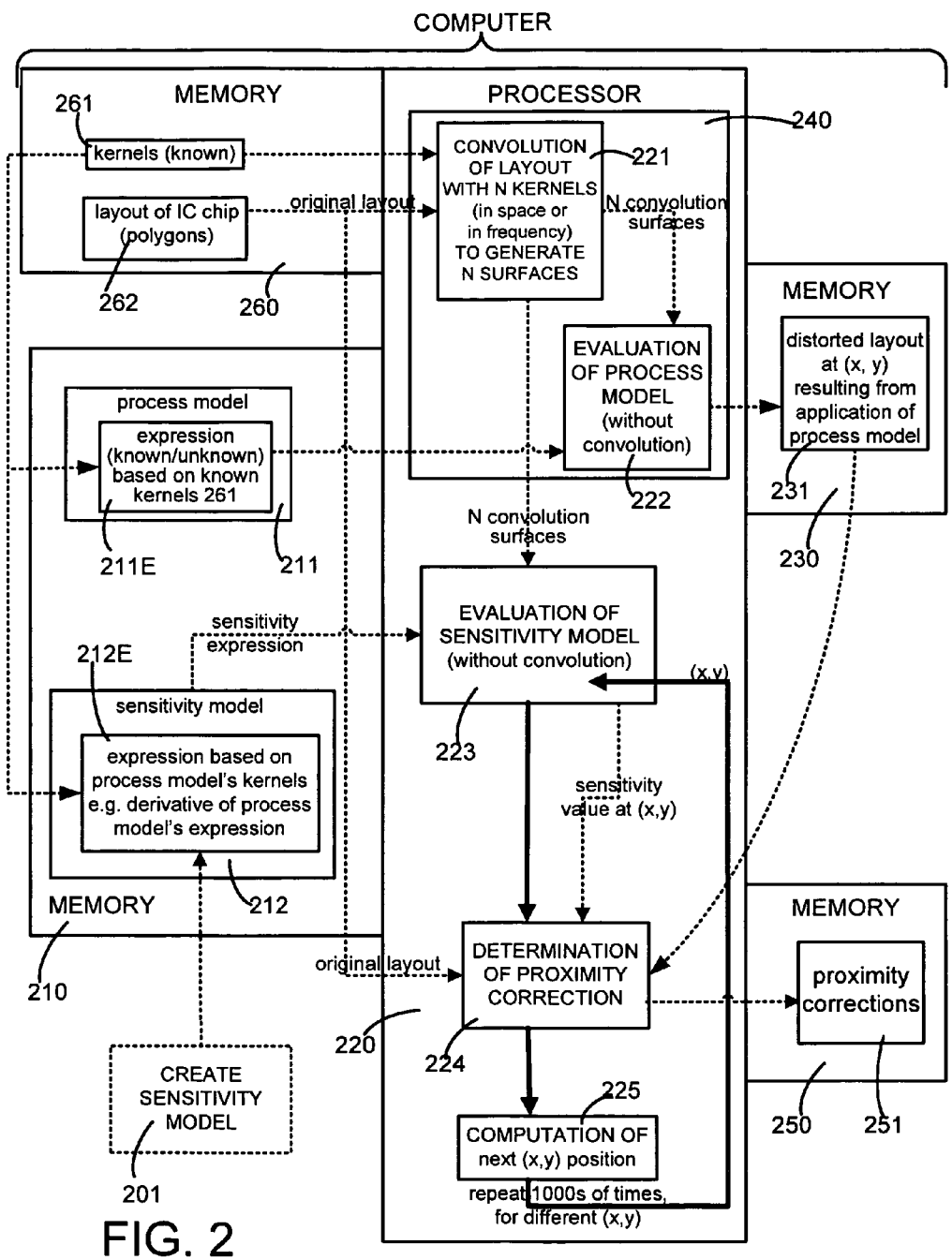
FIG. 2 illustrates a memory encoded with a sensitivity model in one aspect of the invention, and a processor that uses the sensitivity model in determining proximity corrections in another aspect of the invention.

Regardless of whether convolutions are performed only once (in case of a known expression for the process model) or twice (in case of an unknown expression for the process model whose evaluation performs its own convolutions internally), it is important to note that in most embodiments that use a sensitivity model, convolution calculations (and their related complexity) are excluded from a loop, which is shown in FIG. 2 by thick dark arrows. Specifically, stages 223, 224 and 225 are performed repeatedly in a loop, 1000s of times, once for a current location (x, y) to obtain a sensitivity value in stage 223, followed by determining a proximity correction 251 for the current location in stage 224, followed by identifying the next location (x,y) in stage 225.

Figure 4:
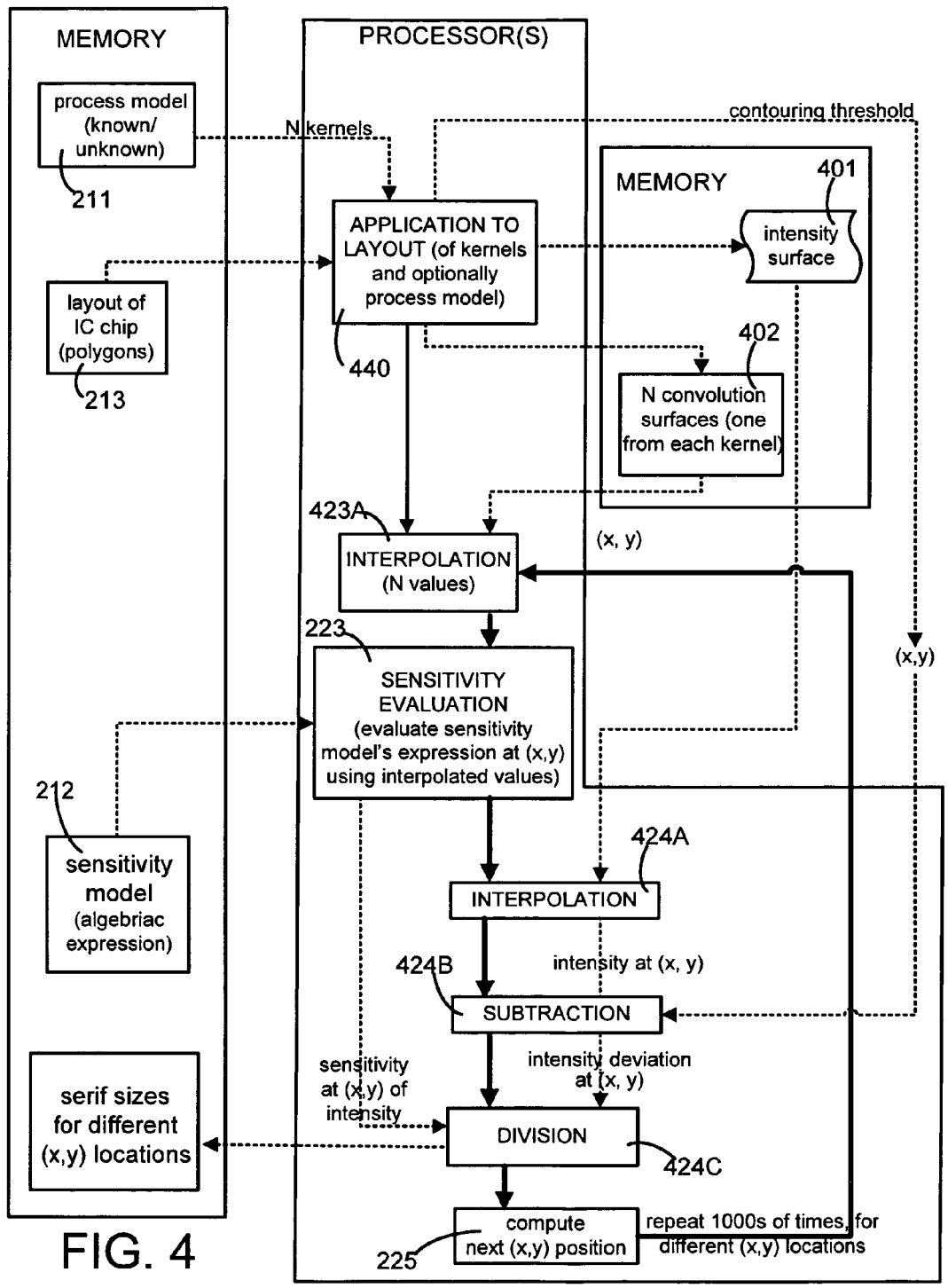
FIG. 4 illustrates embodiments of the type shown in FIG. 2 wherein convolution surfaces from application of kernels to layout are temporarily stored in memory, and sensitivity is evaluated individually from the convolution surfaces in a loop over different locations (x,y).
Figure 7:
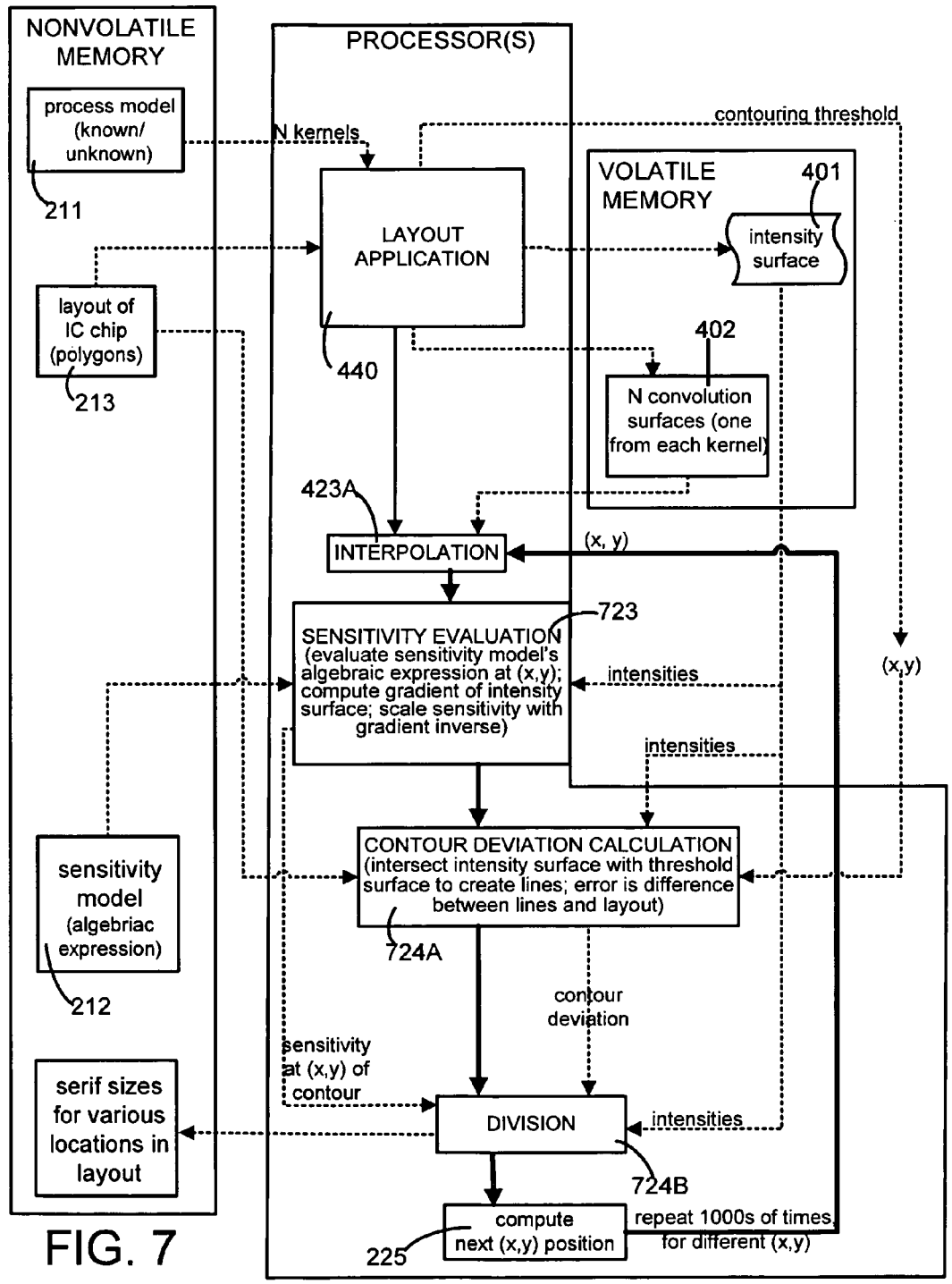
FIGS. 7, 8A and 8B illustrate embodiments of the invention that use MEF (also called "mask error factor") and deviations in contour as deviations in the layout, instead of intensity deviations used in corresponding embodiments shown in FIGS. 4, 5A and 5B.

Stage 223 receives as input the N surfaces generated by convolution stage 221, thereby to eliminate the computational complexity and memory requirement involved in performing convolutions. Some embodiments use the N convolution surfaces during each iteration of the loop, as illustrated in FIGS. 4 and 7. Other embodiments further reduce computations performed in the loop, by using the N convolution surfaces in stage 223 just once, to pre-compute and store a sensitivity surface that identifies a sensitivity value at each location on a grid that covers the original layout, and it is the sensitivity surface that is used repeatedly (optionally by interpolating therein if a current location falls between grid points) during each iteration of the loop, as illustrated in FIGS. 5A, 5B, 8A, 8B, and 12.

In many embodiments, stage 224 which is in the loop, is implemented as a simple arithmetic operation of computing a difference between a value of the distorted layout (from stage 222) at the current location and another value of the original layout 262 at the current location, followed by dividing the difference by the sensitivity value. Note that in some embodiments, the layout contours are not in fact computed, and instead the corresponding intensity values (which yield the layout contour on application of a threshold) are directly used to compute the difference.

In FIG. 2 et seq, arrows with dashed lines are used to denote the flow of data, and arrows with continuous lines are used to denote flow of control within a processor 220 that implements stages 221-225. As noted above, heavy lines form a loop that is performed 1000s of times. Note also that in FIG. 2, solid arrows are not shown among stages 221, 222 and 223 because these stages can be performed in any order relative to one another, depending on the embodiment, as illustrated in FIGS. 3A and 3B.

Although four different memories 210, 230, 250 and 260 are shown in FIG. 2, as will be apparent to the skilled artisan, any number of memories (even a single memory) can be used instead, depending on the embodiment. Also depending on the embodiment, one or more of memories 210, 230, 250 and 260 can be volatile, non-volatile, or combination thereof and can be cache, main memory, hard disk or combination thereof. Moreover, instead of a single processor 220 as shown in FIG. 2, any number of processors that communicate with one another may be used to implement any one or more of stages 221-225 or portions thereof, depending on the embodiment.

Also note further that stages 221-225 may be performed in any order relative to one another, unless a specific order is imposed thereon by the need for data from one stage to be received in another stage. For example, in embodiments that use a process model having a known expression, stage 221 is performed first, followed by stages 222 and 223 in any order relative to one another, and all the just-described stages are performed prior to stage 224. As another example, in embodiments that use an unknown process model, stage 221 is performed in any order relative to stage 222, but both are performed prior to stage 223.

Some embodiments of the type shown in FIG. 2 use a known expression for the process model 211 and are implemented as illustrated in FIG. 3A. As will be apparent to a skilled artisan, in view of this disclosure, other embodiments that also use a known expression may be implemented differently from FIG. 3A. Note that stage 221 and depending on the embodiment stage 222 (FIG. 2) require the layout as input, i.e. these stages involve application of the layout and hence they are grouped together, and shown in a single box 240 that is not further broken down into its respective stages in FIGS. 3A and 3B.

In the embodiments of FIG. 3A, process model 211 and sensitivity model 212 are both stored in non-volatile memory, e.g. on one or more disks. In some embodiments models 211 and 212 are stored on in a single non-volatile memory 270, such as a single hard disk, or a CD-ROM. Depending on the embodiment, non-volatile memory 270 may additionally store the kernels on which models 211 and 212 are based. An original layout (not shown in FIG. 3A; see FIG. 2) may be stored in the same non-volatile memory or may be stored in a different non-volatile memory, depending on the embodiment.

In embodiments of FIG. 3A, as the expression of process model 211 is known, its derivative is created in an operation 301 which can be performed manually or automatically depending on the embodiment. As the process model's expression is known in embodiments illustrated in FIG. 3A, N convolution surfaces which are generated by stage 221 are used in stage 322A in addition to being used in stage 223. Generating convolution surfaces only once in stage 221, outside of the loop over xy coordinates, and their dual use in evaluating both the process model 211 and the sensitivity model 212, further reduces computation time, as compared to processes that calculate N perturbed convolution surfaces within the xy loop.

In each of evaluation stages 322A and 223, the respective expressions are used to algebraically combine N convolution values for a current location (x,y) that are obtained from the corresponding N convolution surfaces. A specific algebraic combination that is performed in each of stages 322A and 223 depends on the form of each expression. In one example, the process model expression is a sum of squares of the N convolution values, and the sensitivity expression is a summation of N products obtained by multiplying N convolution values with N constants, such as "Kernel Center Values" in case of square shaped serifs and/or "Kernel Cross Section Values" in case of finite-width infinite-length serifs.

Figure 10A:
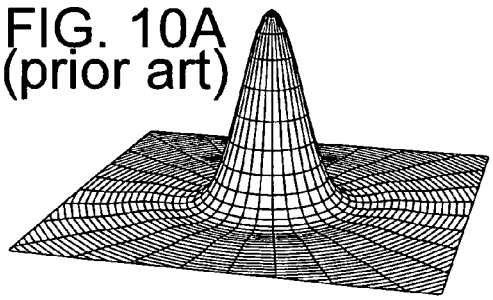
FIGS. 10A and 11A show the prior art kernels in FIGS. 1F and 1G which are repeated for convenience.
Figure 11A:
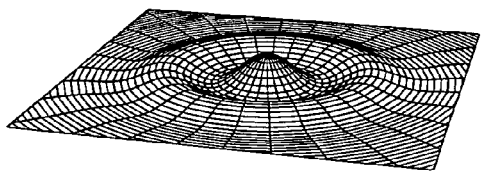
Figure 10B:
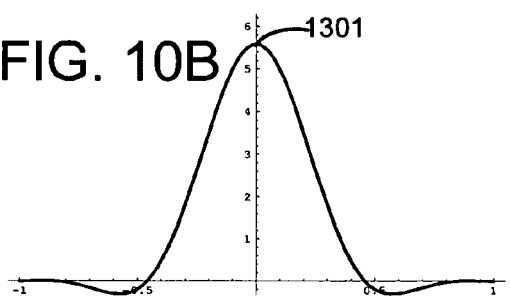
FIGS. 10B and 11B illustrate the Kernel Center Values that are obtained in some embodiments of the invention, from the respective kernels shown in FIGS. 10A and 11A.
Figure 11B:
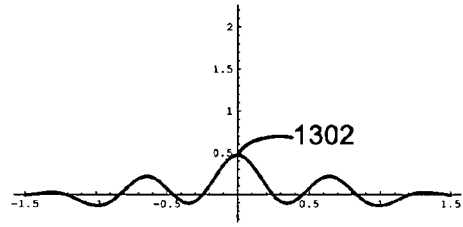
Figure 10C:
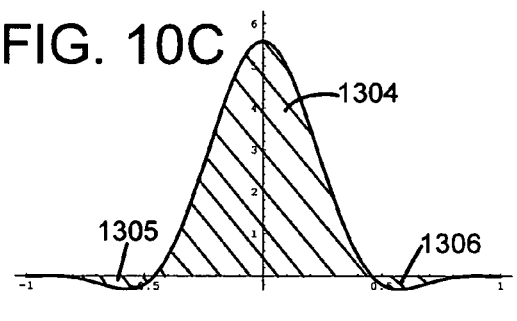
FIGS. 10C and 11C illustrate the Kernel Cross-section Values that are further obtained in certain embodiments of the invention, from the respective kernels shown in FIGS. 10A and 11A.
Figure 11C:
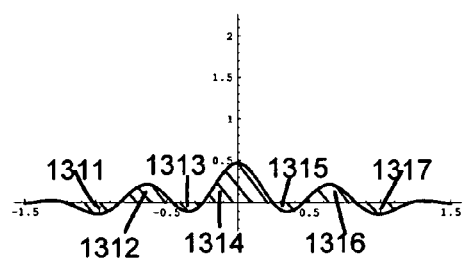

The N constants (also called "expression constants") are obtained, in such embodiments, from the respective N kernels, illustrated as values 1301 and 1302 (see FIGS. 10A and 10B respectively) at a center coordinate thereof, i.e. with radius r=0 in case of Kernel Center Value or as the area of cross-section obtained by cutting through the kernel along a predetermined angle θ (typically the x-axis) in case of Kernel Cross Section Values (illustrated as the integrated area, or 1304–1305–1306 in FIG. 10C and 1312+1314+1316–1311–1313–1315–1317 in FIG. 11C). Note that while the specific kernel forms depend on the specific embodiment, certain embodiments use kernels of the form $K_{n,s}(x,y)=f_s(r)*\cos(n*\theta)$, where n is an index that describes the kernel shape as a function of theta, and s is an index that sequentially numbers multiple shapes in the radial direction. Kernels where n>=1 exist in pairs, although only one of the pair may appear in a process model file. For example, a the kernel pair for n=2 are as follows: f1(r)*cos(2*theta) and f1(r)*sin(2*theta).

Figure 1F:
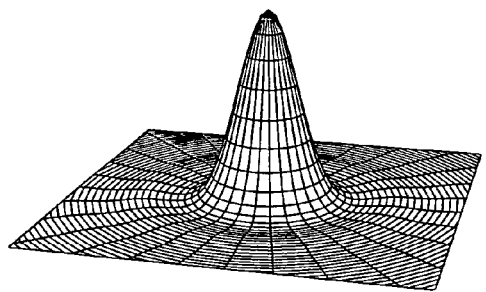
FIGS. 1F-1O are exemplary kernels used in a process model of the prior art.
Figure 1I:
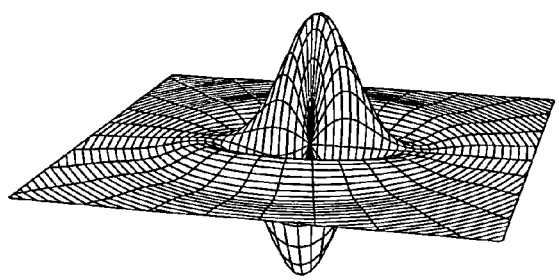
Figure 1G:
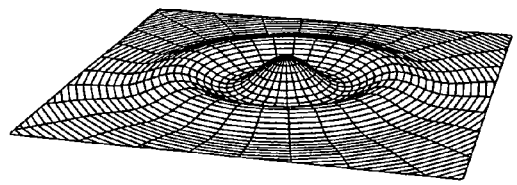
Figure 1J:
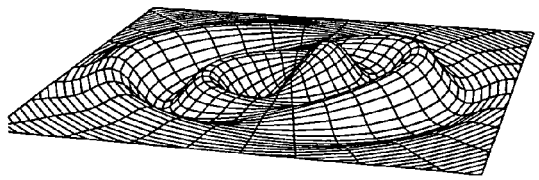
Figure 1H:
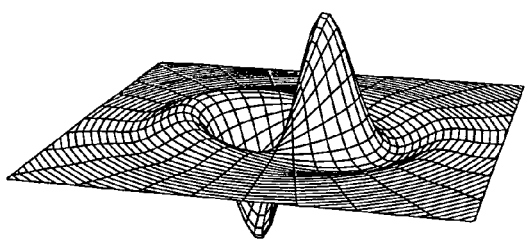
Figure 1K:
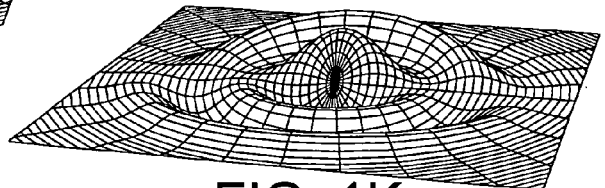
Figure 1L:
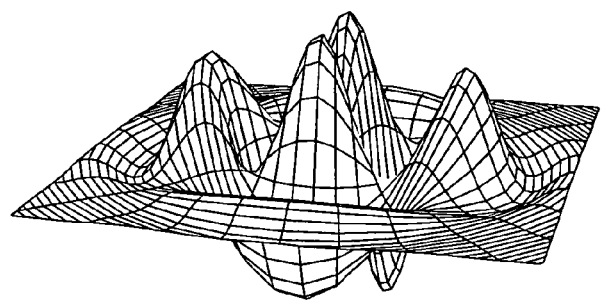
Figure 1M:
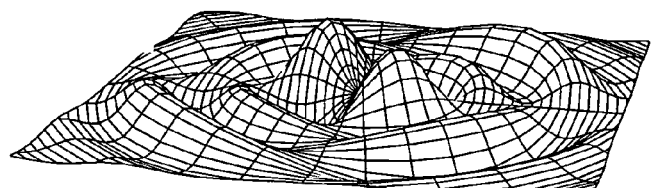
Figure 1N:
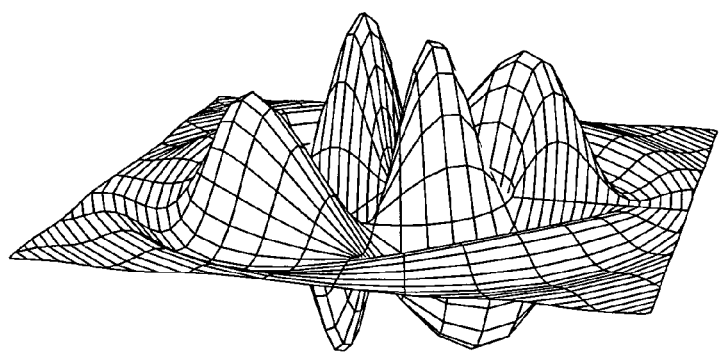
Figure 1O:
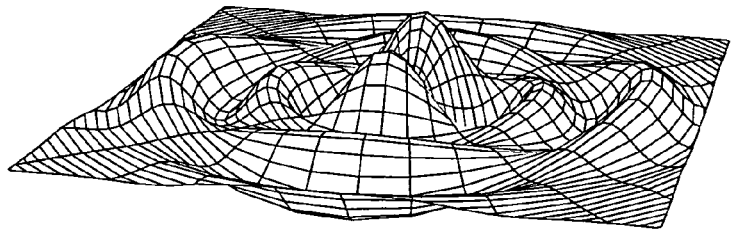

In several such exemplary embodiments, convolution with one particular kernel, such as the kernel shown in FIG. 1F, dominates the sensitivity expression, and an approximation is made in these embodiments by dropping the remaining terms in the derivative, so that a sensitivity expression can be evaluated in stage 223 by performing just one multiplication. An example of the single multiplication is between the convolution value at the current location (x,y) for the kernel in FIG. 1F (which is received from stage 221), with a scaled version of the Kernel Center Value (in case of a square serif) for the kernel in FIG. 1F, as the expression constant. In some embodiments, the expression constant (e.g. scaled version of the Kernel Center Value) is computed ahead of time prior to entering stage 223, to reduce computation complexity in the loop. For example, the scaling factor, such as 2, is multiplied with the Kernel Center Value for the kernel in FIG. 1F, ahead of time to avoid performing this multiplication in the loop.

A number of embodiments of the type shown in FIG. 2 use an unknown expression for process model 211 and are implemented as illustrated in FIG. 3B. Other embodiments that use an unknown expression may be implemented differently from FIG. 3B. In the embodiments of FIG. 3B, as the expression of process model 211 is unknown, its algebraic derivative is not obtained directly, but a derivative is determined empirically. Hence, such embodiments perform an operation 302 that assumes the process model 211 for a predetermined wafer fabrication process (e.g. a process for a metal layer) to be of some maximum order (typically a $2^{nd}$ order expression) and creates a sensitivity model 212 where expression 212E is one order less than the maximum (typically a $1^{st}$ order linear expression) and takes as arguments, the convolutions of kernels with the layout. Operation 302 invokes an API or other interface to process model 211, to see how the process model distorts a number of shapes that are likely to be present in an original layout. Operation 302 also convolves the kernels with original shapes and with corresponding distortions, and uses the difference between the resulting process model values to solve a set of simultaneous equations, for constants in the linear expression 212E.

When operation 302 completes, expression 212E which models the sensitivity is completely known. Although expression 212E containing convolutions equal in number to the number of kernels may be used in a sensitivity model 212 for some fabrication processes, other fabrication processes may be sufficiently simple to be modeled by convolution of a single kernel, as described above in paragraph [0071]. Hence operation 302 in some embodiments assumes expression 212E for the sensitivity model 212 is a product of the single convolution with a constant, and solves for the constant empirically (by invoking the API for one or more typical shapes and using the responses to solve a set of simultaneous equations for the constant). Operation 302 can be performed manually or automatically depending on the embodiment. Implementation of such an operation 302, to create sensitivity model 212 in some embodiments is illustrated in FIG. 6, which is described below in detail.

As the process model's expression is unknown, stage 322B repeatedly invokes the API for each of a number of locations (x,y) in the original layout. Note that stage 322B may be performed prior to stage 221 because stage 322B may not use convolution values generated by stage 221. Alternatively, stage 221 may be performed prior to or simultaneously with stage 322B. Note that each of stages 322A and 322B (in respective FIGS. 3A and 3B) require a layout as input, although stage 322A receives the layout information indirectly, in the form of convolution results, while stage 322B may receive the layout directly or may receive it indirectly in the form of convolution results from 221, depending on the embodiment.

Stages 223 and 224 of FIG. 2 that are repeatedly executed in the loop over different locations (x,y) are improved in their computational complexity in some embodiments that compute layout deviations in the form of intensity deviations, as illustrated in FIG. 4. Items shown in FIG. 4 are similar to corresponding items shown in FIG. 2. Reference numerals for many items in FIG. 4 are derived from reference numerals of corresponding items in FIG. 2 by adding 200 thereto.

Stages 440 that are applied to a layout in FIG. 4 are similar or identical to stages 240 in FIG. 2, except that stages 440 stop short of computing the distorted layout itself and instead stages 440 supply two pieces of data from which the distorted layout can be computed, e.g. intensity surface 401 and contouring threshold. As noted above, the intensity that is obtained by evaluation of process model 211 is not limited to optical effects but also takes into account resist effects and etch effects. A number of intensity values are obtained for a corresponding number of grid points on a grid overlaid on the original layout 213, and all the values are stored in a 2-D array 401 in memory, which is also referred to as an intensity surface. The N convolution values at each grid point are also stored temporarily in memory as N surfaces 402.

The size of a grid used in stages 440 may be made larger than the distance between two adjacent locations (x,y) at which proximity correction is done in the loop. For this reason, embodiments of the type shown in FIG. 4 use two interpolation stages 423A and 424A that look up adjacent locations in surfaces 402 and 401 and perform interpolation on the looked up values. Any prior art method of interpolating between four (or more) grid points may be performed to generate an approximation of a corresponding value at any desired location.

N convolution values (one for each of N convolution surfaces 402) that are generated by interpolation stage 432A for each location (x,y) are supplied to sensitivity evaluation stage 223 for use in evaluating the algebraic expression in sensitivity model 212. Note that these embodiments of FIG. 4 use stage 223 in the same manner as that described above in reference to FIG. 2, except that the input supplied thereto has been obtained by interpolation. Note that while some embodiments use interpolation stages 423A and 424A, other embodiments avoid interpolation by selecting a grid size for use in stages 440 to be identical to the distance between adjacent locations (x,y) in the loop for calculation of proximity corrections.

The embodiments of FIG. 4 calculate the distortion at any point (x,y) by comparison in a subtraction stage 424B that receives data from an upstream operation namely the intensity value at location (x,y) from interpolation stage 424A and the contouring threshold from stages 440. In some process models, the contouring threshold is a constant. A cut-line through the intensity surface at this constant value results in closed contours that represent the distorted polygons in the distorted layout. In other process models, the threshold value is an expression, and the threshold value varies depending on the (x,y) location. One common variable threshold model defines the threshold as a constant term, plus a second term which is a scaling constant times the gradient of the intensity surface at that (x,y) point. The scaling of the second term is such that the threshold varies about some nominal value, such as 0.30, but may range from 0.27 to 0.33, depending on the gradient of the intensity surface at that (x,y) point. Examples and descriptions of other variable threshold forms are found in the prior art articles on creating process models as described above in the Background Section.

The embodiments of FIG. 4 calculate the distortion in step 424B within the loop that repeats for each (x,y) location. In these embodiments, the distortion is represented as the difference (or error) between a contour threshold and the process model intensity at that point. By comparison, in FIG. 2, the distorted layout 231 is represented more generally, for example, as a set of distorted contours, as a map of the intensity error (difference from the contour target) at all (x,y) points, or as table of contour errors (distance from the contour to the original polygon edge) at all polygon edge points.

The result from subtraction stage 424B, which is the deviation in intensity (a form of layout deviation) is supplied to a division stage 424C that divides the intensity deviation by the sensitivity to obtain a size of the serif. The serif size generated by stage 424C is stored in memory, for use in generating a corrected layout by a proximity correction tool, such as Proteus available from Synopsys, Inc. Alternatively, if the shape of the serif is known for this (x,y) point (for example the serif width or length is fixed), then the actual dimensions of the serif are stored in memory.

Figure 5A:
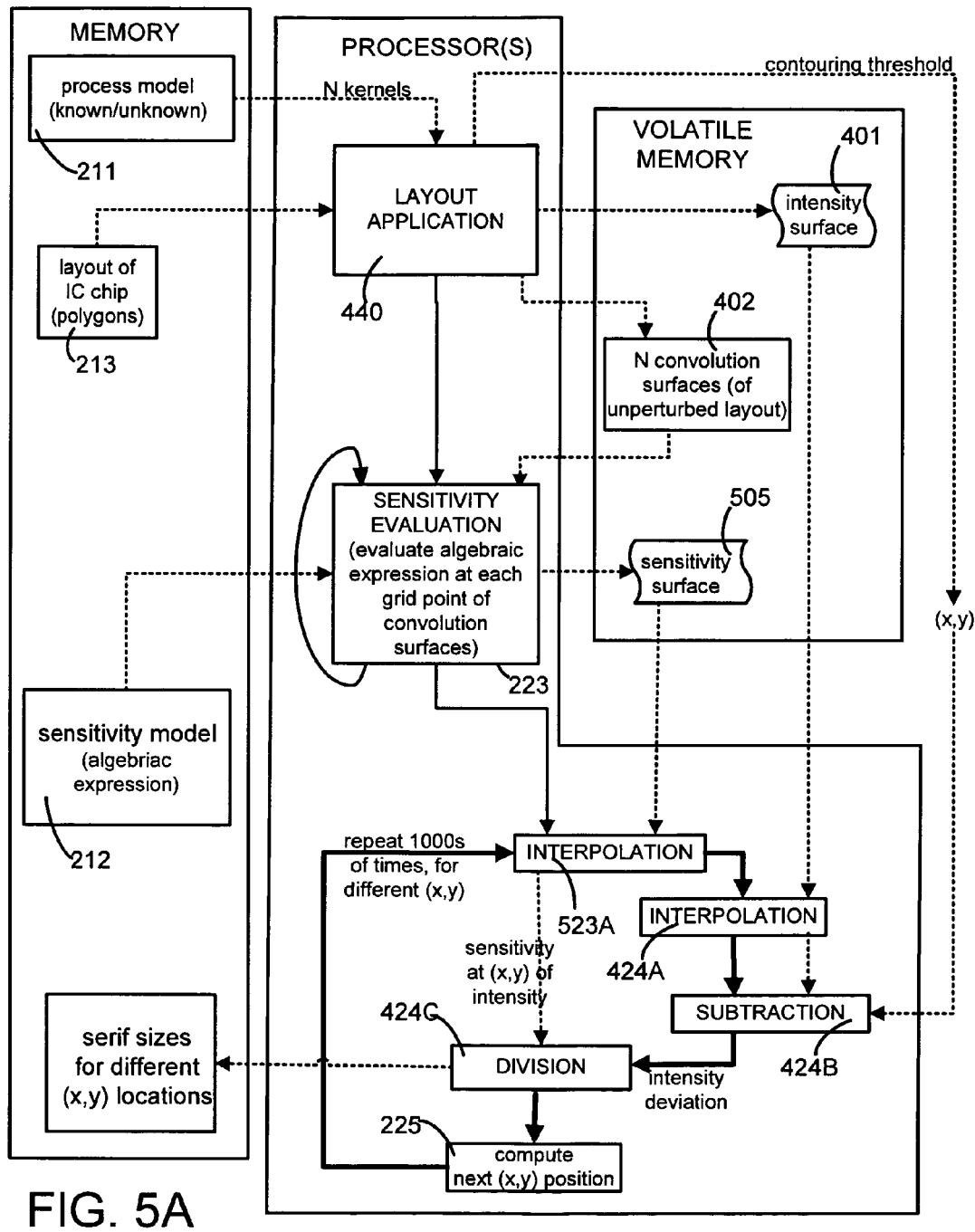
FIG. 5A illustrates some variants of embodiments shown in FIG. 4 wherein sensitivity is evaluated ahead of time at several locations in a grid overlaid on the layout and stored as a sensitivity surface, and the sensitivity surface is used in interpolation that is performed in the loop over different locations (x,y).

Embodiments illustrated in FIG. 4 can be improved in computation speed by removing the sensitivity evaluation stage 223 from the loop over different locations (x,y), as illustrated in FIG. 5A. Specifically, the sensitivity evaluation stage 223 is used by the embodiments of FIG. 5A to precalculate a sensitivity value at each grid point in a grid used in stages 440. Note that there is no interpolation prior to stage 223 in these embodiments of FIG. 5A. The sensitivity value at each grid point is temporarily stored in memory (which may be a volatile memory), as a sensitivity surface 505.

During performance of the loop over different locations (x,y), embodiments illustrated in FIG. 5A use an interpolation stage 523A to generate a sensitivity value at current location (x,y), which is thereafter used in division stage 424C. Stage 523A differs from stage 423A in that only one interpolation is performed in stage 523A, as compared to N interpolations in 423A. Also, in these embodiments, the evaluation of the sensitivity expression in 223 has been moved out of the (x,y) loop. Moreover, in these embodiments of FIG. 5A, stages 424A, 424B and 424C operate in the same manner as described above in reference to FIG. 4. Note that the computation speed of the loop over different locations (x,y) has been significantly improved in the embodiments of FIG. 5A because all stages 523A, 424A, 424B, 424C and 225 that are in the loop perform only arithmetic operations. Several such embodiments store the two surfaces 401 and 505 in a memory that the processor can access quickly (such as a cache), thereby to further speed up execution of the loop.

Figure 5B:
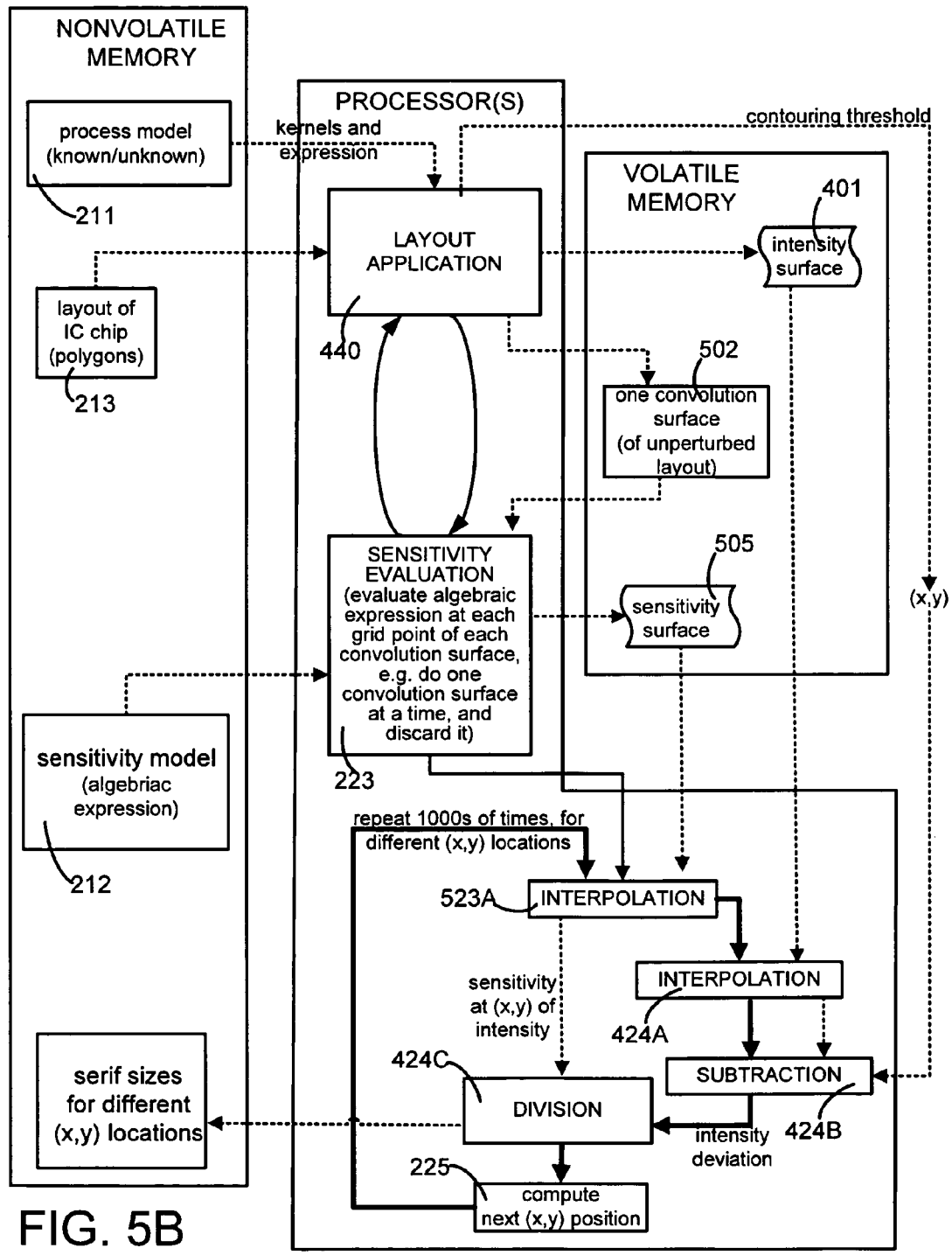
FIG. 5B illustrates additional variants of the type illustrated in FIG. 5A that generates the sensitivity surface incrementally by accumulation of each kernel's convolution values at all locations in a grid, thereby to reduce memory otherwise required to simultaneously hold all N convolution surfaces.

Several embodiments reduce the memory used in stages 440 and 223 that are performed outside of the loop, as illustrated in FIG. 5B. Specifically, in FIG. 5A, stage 440 generates all N convolution surfaces 402 that are temporarily held in memory for use by stage 223. Depending on the grid size, the number of locations (x,y) at which the convolution surfaces have values can be large, and hence the total memory required to hold N convolution surfaces and one intensity surface could become sufficiently large to cause such embodiments to execute slowly (due to memory constraints).

For the just-described reason, some embodiments as illustrated in FIG. 5B, maintain only one convolution surface in memory, by performing stages 440 and 223 repeatedly in a loop over different kernels. Specifically, during each iteration of this kernel-based loop, stage 440 applies a single kernel and accumulates a set of partial intensity values (at each grid point) for intensity surface 401. Also during each iteration, stage 223 evaluates the sensitivity expression and accumulates a set of partial sensitivity values (at each grid point) for sensitivity surface 505. After accumulation of the respective values in the surfaces 401 and 505, the convolution surface 502 that was used to generate them is overwritten by the convolution surface resulting from application of the next kernel to the layout, by stage 440.

Note that convolutions of an original layout with a single set of kernels (that are used in both a process model and a sensitivity model) can be implemented either in the space domain or in the frequency domain, as discussed in subsection A below, depending on the embodiment. Specifically, FIGS. 2, 3A, 3B, 4, 5A and 5B illustrate equally well numerous embodiments that can be implemented in either or both domains.

A computer may be programmed to automatically generate a sensitivity model empirically, by solving for constants of a given form of a sensitivity expression. For example, if a first order expression is to be used in a sensitivity model, such a computer is programmed in some embodiments to automatically use the process model to set up an N×(N+1) array which represents N linear equations with N unknowns, wherein N is the number of kernels. The array is automatically solved in these embodiments, to obtain coefficients of the linear expression that is then saved for future use as the sensitivity model.

Figure 6A:
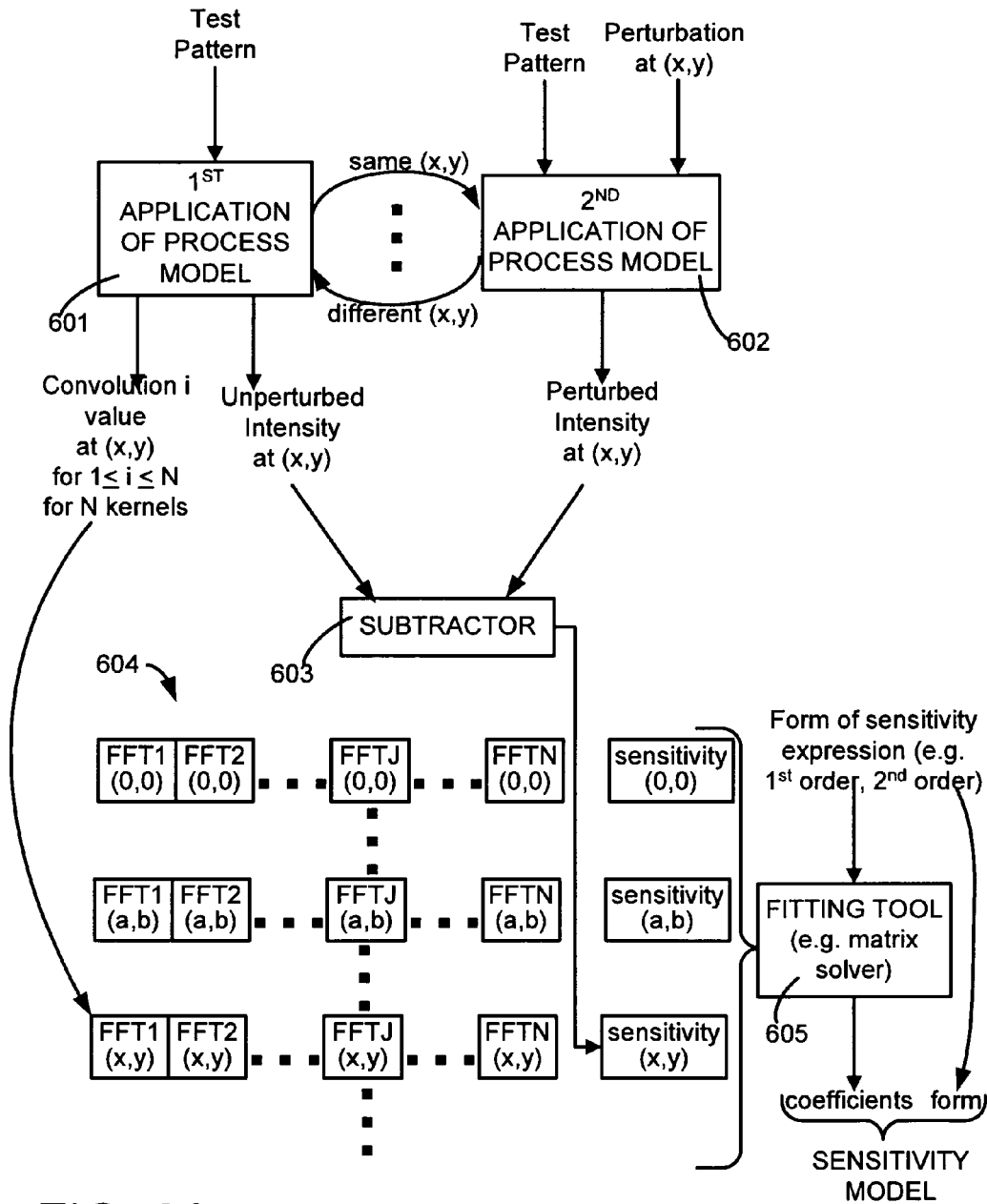
FIG. 6A illustrates, in a data flow diagram, creation of an expression by using empirical data, for use in a sensitivity model of some embodiments of the invention.
Figure 6B:
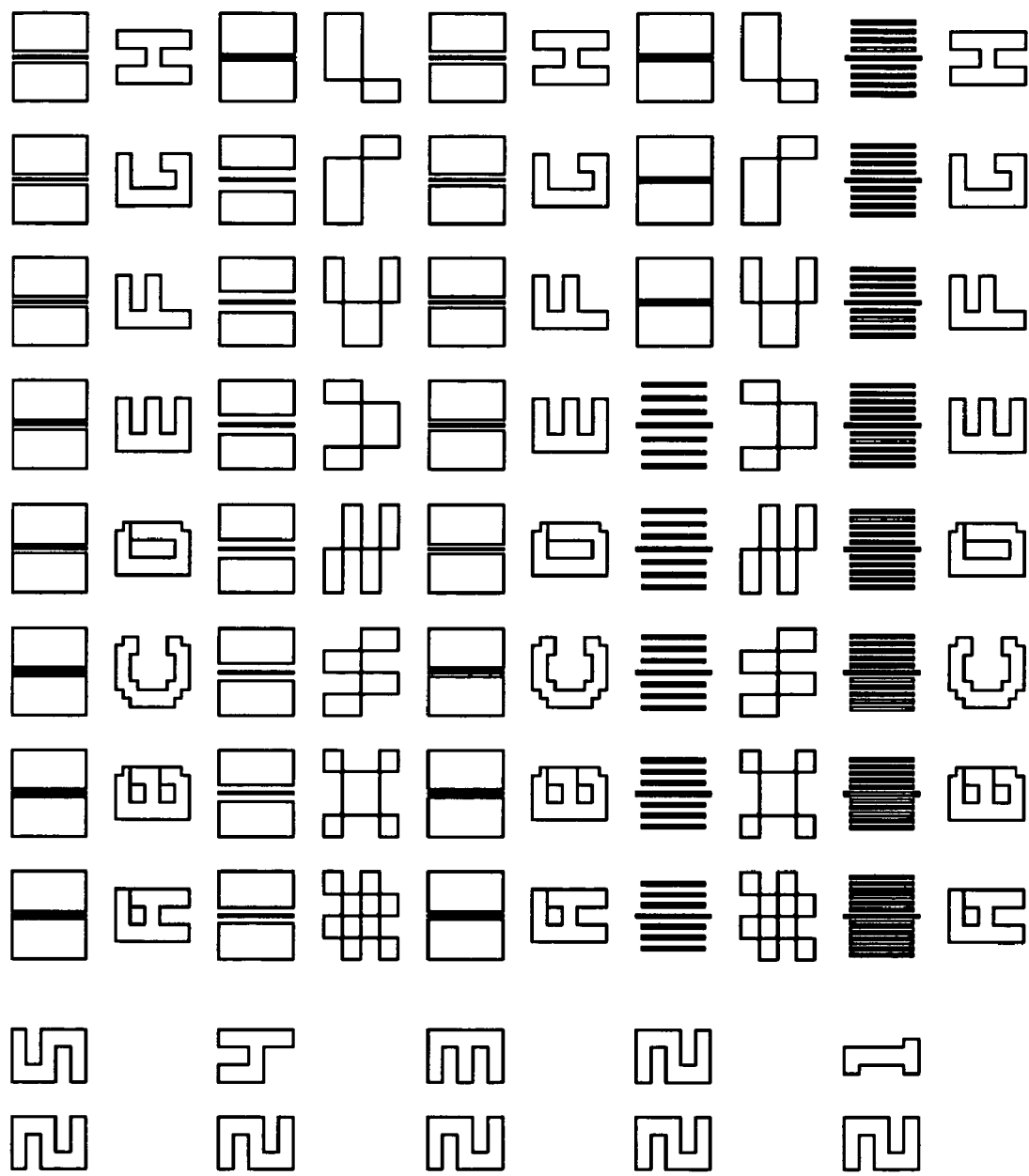
FIG. 6B illustrates an exemplary test pattern that is input to a process model, when creating the linear expression of FIG. 6A.

Several illustrative embodiments automatically generate a sensitivity model (as illustrated in FIG. 6A) by two applications of a process model at each of several locations (x,y) in a test layout (shown in FIG. 6B). The test layout (FIG. 6B) may be manually prepared, to contain features that are typically present in a layout that is to be proximity corrected. In addition to the test layout and the process model, the computer of several embodiments receives as input e.g. from a human through a graphical user interface (GUI) a form of the expression to be used for the sensitivity model (e.g. $1^{st}$ order or $2^{nd}$ order).

In the embodiments illustrated in FIG. 6A, the process model is applied twice at each location (x,y): once in stage 601 with the test pattern by itself (i.e. unperturbed), and a second time in stage 602 with the test pattern perturbed by addition of a serif at the location (x,y). The application of the process model in stages 601 and 602 could use any known methods for evaluating a process model, including the methods in subsection A. Stages 601 and 602 respectively generate an unperturbed intensity value and a perturbed intensity value, that are subtracted from each other by stage 603, and the result of subtraction is stored in an array 604, as described next. Specifically, array 604 in a memory of this computer is a two dimensional array of N+1 columns, wherein N is the number of kernels. Each row of this array 604 holds the results generated by stages 601 and 603 at a single (x,y) location. The N columns of each row in memory 604 hold N convolution values, for each of N kernels used by stage 601. Note that array 604 does not hold the precise (x,y) values that were used to generate the convolution values because the (x,y) values are irrelevant to solving for constants in the sensitivity expression.

After each row in the array 604 is filled, a new location (x,y) is selected and the process is repeated until there are as many rows as necessary. Each location (x,y) may be selected at random, e.g. to be on an edge of a polygon. The number of rows that are necessary depends on the form of the sensitivity expression, e.g. for a linear expression, only N+1 rows are needed, one for each kernel and a constant term. Thereafter, a fitting tool 605 (such as MATHEMATICA OR MATHCAD) is invoked to invert the N×(N+1) array of convolution values, followed by multiplication with the 1×N vector of sensitivity values, thereby to obtain the N+1 coefficients of the linear expression to be used as the sensitivity model.

A test layout for input to stages 601 and 602 may be automatically generated by a suitably programmed computer, e.g. by selection of a region of the to-be-corrected layout, either automatically by the computer or manually by the human through the GUI or some combination thereof. Selection of a region in the layout as a test layout may be done randomly and/or pursuant to a predetermined selection criterion that is indicative of likelihood of the region to contain typical features. In one example, a region of a predetermined size (e.g. input by a human through the GUI or hard-coded into the software) is randomly selected followed by counting the number of times that certain predetermined shapes (e.g. line ends and corners) are present. If the count for each shape exceeds a predetermined threshold for that shape, the region is used as the test layout, and if any count falls short the selection process is repeated.

In many embodiments, the number of rows (or sample points) for fitting the model is selected to be greater than the number of coefficients in the model. To fit a first order model, the minimum number of rows is 'N+1' corresponding to one coefficient for each kernel, plus a constant term. In the typical case of a $2^{nd}$ order model, where there are no first order terms, and no cross terms between convolution surfaces, the minimum number of rows is 'N+1'. If the linear terms are included, this minimum becomes '2N+1'. The number of terms in the empirical fit determines the minimum number of rows in the model. Since the row data in many embodiments is calculated directly from the process model, it is noiseless (other than the precision of the computer which is much smaller than our measured intensity result). Therefore it is acceptable to increase the number of rows above the minimum requirement without fear of creating problems for a regression fitting software tool (e.g an internal matrix inversion).

Most known regression fitting software tools, including Mathematica and Mathcad, can fit a coefficient to $2^{nd}$ order (and higher) terms by internally generating a new column of data that contains the squared (or higher order) results. For these regression tools, it is not necessary to expand the data structure to include columns representing the squared (or higher order) values. For other regression tools, that may be used in some embodiments, additional columns are added to the data structure, where each new column corresponds to a higher order term in the model, and the data in that column is calculated by the equivalent high order operation on the original N convolution values.

One method to empirically determine the process model's sensitivity to a perturbation is described below in subsection D in paragraph [0137]. The method in subsection D is merely illustrative of one implementation of this embodiment, which is provided by way of example, and numerous embodiments, variants and implementations will be apparent to the skilled artisan in view of this disclosure. Note that any method to empirically fit an unknown process model can also implement embodiments that use known process models.

While FIG. 6 and subsection D describe methods to fit a sensitivity model empirically, in cases where the process model kernels 261 and expression 211E are known, certain embodiments are implemented by use of an analytical method involving differentiation of the process model (either automatically or manually) to create the sensitivity model as described below in subsection E in paragraph [0138].

In many embodiments as described above, a square shaped serif is used to represent any arbitrary shaped serif of the same area. However, other serif shapes may be used in other embodiments. For example, a serif of infinite length and finite width is preferred when working with long lines, where we would consider a line to be long if it extends in both directions from our (x,y) point, farther than the width of the convolution Kernels. The finite width calculated for an infinite serif very closely approximates the optimal serif width to use on long lines. To calculate the sensitivity of the process model with respect a serif of infinite length, one makes the following changes to square-serif embodiments. In the derivation of the sensitivity model using an algebraic derivative as described in subsection E replace the 'Kernel Center Value' with a 'Kernel Cross Section Value' which is defined by cutting a cross section through the kernel, through the origin and along a predetermined theta direction.

The 'Kernel Cross Section Value' is the integrated area under the curve created by the cross section, as shown in FIGS. 10C and 11C. When the kernel value is above the x-axis, the area contribution is positive; when the kernel value is below the x-axis, the area contribution is negative. Area For circular symmetric models, where the process model yields the same result, regardless of the theta orientation of the IC layout, then the preferred axis for making the cross section is the theta=0 direction (the x-axis). For circular asymmetric models, such as the common Quadrapole imaging systems, both the process model and the sensitivity model change their values as the IC pattern is rotated. In this case, the sensitivity model depends on the direction of the infinite length serif For example, in quadrapole imaging systems, adding the infinite length serif parallel to the x or y axis produces one sensitivity. Adding the infinite length serif parallel to the x=y or x=−y (forty five degree slopes) produces a second different sensitivity. In this case there is potentially a different sensitivity model for every theta direction that the infinite serif may be placed. In practice, the serif is placed in only two orientations—parallel to the x or y axis; or at forty five degrees to the x or y axis. In this practical case, only two sensitivity models are required. The respective 'Kernel Cross Section Values' for these two sensitivity models is calculated at theta=0 (x-axis), and the theta=45 (diagonal cross section).

When using an infinite serif of finite width, the units for the sensitivity model become "change in process model per change in unit width". The evaluation of the sensitivity model in act 223 is similar or identical to that described above. Also, the calculation a serif size results in units of width, not area. However, the serif size calculation in act 224 is also similar or identical to that described above. The serif sizes at each xy point, saved in memory, are now in units of width, not area. In practice, a mix of serif shapes is used within the same xy loop. At some xy locations such as line-ends, the square serif is a good estimate, and along long lines, an infinite length serif is used in several embodiments.

In some embodiments, a process layer (such as a metal layer or a polysilicon layer) includes more than one polygon type. For example, one PSM (phase shifting mask) lithography technique involves three data layers (Phase Layer A, Phase Layer B, and Trim Layer) and all three data layers are used to image a single process layer. In such embodiments ("multi-sensitivity" embodiments), there may be one sensitivity model for each data layer. When a tool for OPC (such as Proteus available from Synopsys, Inc.) adds a serif, it could be added in any data layer. Depending on the data layer of the serif, one uses the corresponding sensitivity model for that data layer.

In multi-sensitivity embodiments, if using the algebraic derivative of the process model, the sensitivity model for Phase Layer A uses only those kernels that are convolved with Phase Layer A polygons. Kernels convolved with the other layers are considered constants. The sensitivity model for the trim layer uses only those kernels that are convolved with the Trim polygons. This rule is consistent with the rule for derivatives on multivariable functions.

In multi-sensitivity embodiments, if using the empirical fit method of deriving the sensitivity function, the process is repeated once for each data layer. For the first data layer, add a polygon perturbation of that layer type, then fit the sensitivity model as described. Then repeat the entire process for 'M' data layers, but use a serif of the $M^{th}$ data type. When done, the result is a potentially different sensitivity model for each data layer.

In multi-sensitivity embodiments, the maximum potential number of convolution surfaces output from stage 240 is one surface for each combination of kernel and data layer. If all N kernels are used on all M data layers, then there are N*M convolution surfaces. Such multi-sensitivity embodiments use the multiple sensitivity models and/or multiple sensitivity surfaces to calculate proximity corrections for each data layer. For example, a tool such as Proteus is used to add serifs to polygons, by using the type of polygon and serif to identify a corresponding sensitivity model for that polygon and serif type. The identified sensitivity model is then used to calculate the serif size.

Although several embodiments of the type described above compute proximity corrections based on intensity values, other embodiments compute errors in the contour positions by calculating a value called "MEF", at each (x,y) location. MEF stands for 'Mask Error Factor' and is the change in a modeled linewidth (in a distorted layout) per unit change in the drawn linewidth (in the original layout). MEF measures a sensitivity in the contour position (a lateral displacement in the contour) as compared to an intensity based sensitivity that measures a change in the intensity at a given (x,y) point. For more information on MEF, see the following articles which are both incorporated by reference herein in their entirety: (1) "The mask error factor in optical lithography" by Wong, A. K.; Ferguson, R. A.; Mansfield, S. M.; IEEE Transactions on Semiconductor Manufacturing, Volume 13, Issue 2, May 2000 Page(s): 235-242 Digital Object Identifier 10.1109/66.843639, and (2) "Theoretical MEF calculation for periodic patterns" by Terasawa, T.; Hasegawa, N.; 2000 International Microprocesses and Nanotechnology Conference, 11-13 Jul. 2000, Page(s): 16-17, Digital Object Identifier 10.1109/IMNC.2000.872602

Any of the embodiments for deriving a sensitivity model, can be extended using a method described herein to create a MEF model. First, the definition of MEF describes the sensitivity to unit change in width of a long line. Therefore, the derivation method for the sensitivity model uses the infinite length, finite width serif shape. Hence, the coefficients in the model corresponding to the 'Kernel Center Value' are replaced with the corresponding coefficients representing the 'Kernel Cross Section Value'.

Several embodiments define a MEF model as:

MEF(x,y)=Sensitivity Model(x,y)/Intensity Gradient (x,y)

The MEF model and the sensitivity model are nearly identical in such embodiments, except the MEF model is scaled by 1 over the gradient of the intensity surface 401 (FIG. 7) at the (x,y) point (i.e. the gradient inverse). A calculation of MEF is illustrated in FIG. 7, by a stage 723 that is similar to the sensitivity evaluation stage 423 described above in reference to FIG. 4, except for the just-described difference. Embodiments illustrated in FIGS. 8A and 8B correspond to embodiments illustrated in FIGS. 5A and 5B, however in FIGS. 8A and 8B, the evaluation in stage 723 includes the intensity surface 401 as an input, and the output of stage 723 is a MEF surface 805.

Figure 8A:
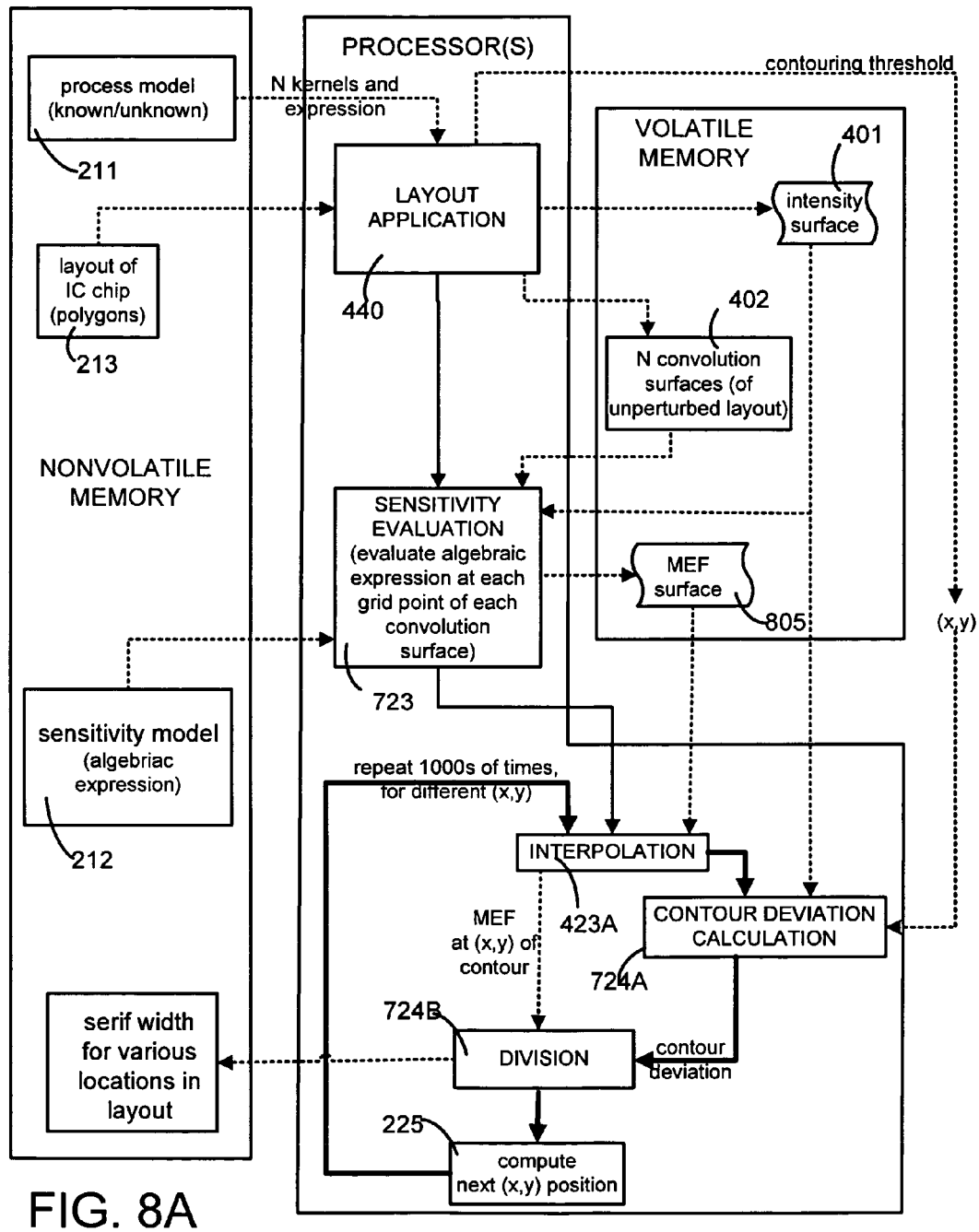
Figure 8B:
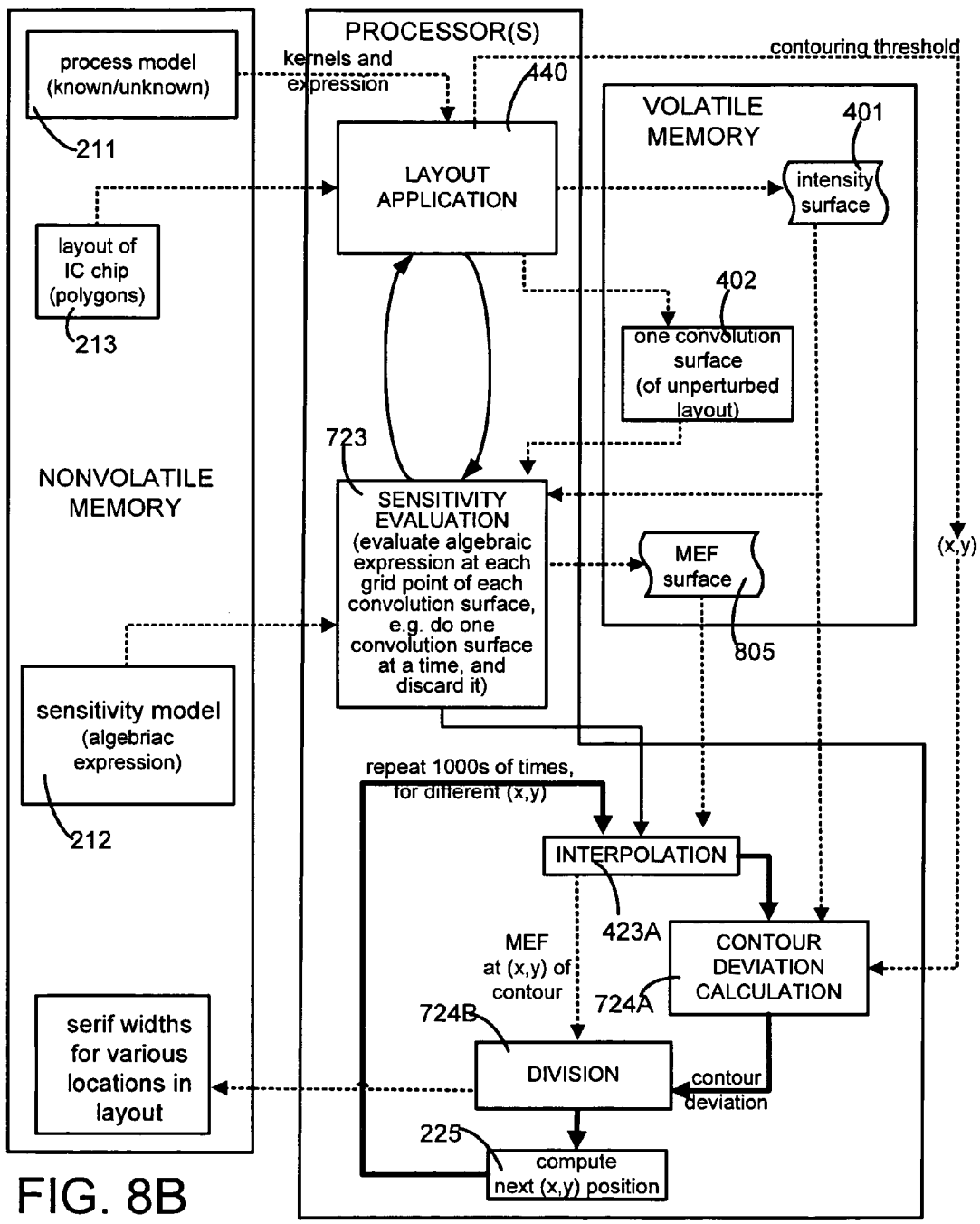

In both embodiments illustrated in FIGS. 8A and 8B, a calculation of the distortion in a contour's position is made by stage 724A. The size of the distortion is divided by the MEF sensitivity in stage 724B resulting in a serif width that is saved in memory.

Several embodiments of the type discussed above lose accuracy for large serif sizes, unless modified as discussed below. The accuracy loss is because the sensitivity when adding a small serif is slightly different than when adding a large serif. To improve the accuracy for larger serifs, some embodiments add higher order terms to the serif size calculation. The relationship between the serif size and the process model error from target, where sensitivity is the derivative of the process model with respect to the serif Area is written as follows:

First order: 1st Der*Area=Change in Process Model     a.

2nd order: 1st Der*Area+2nd Der/2*Area^2=Change in Process Model     b.

Figure 12:
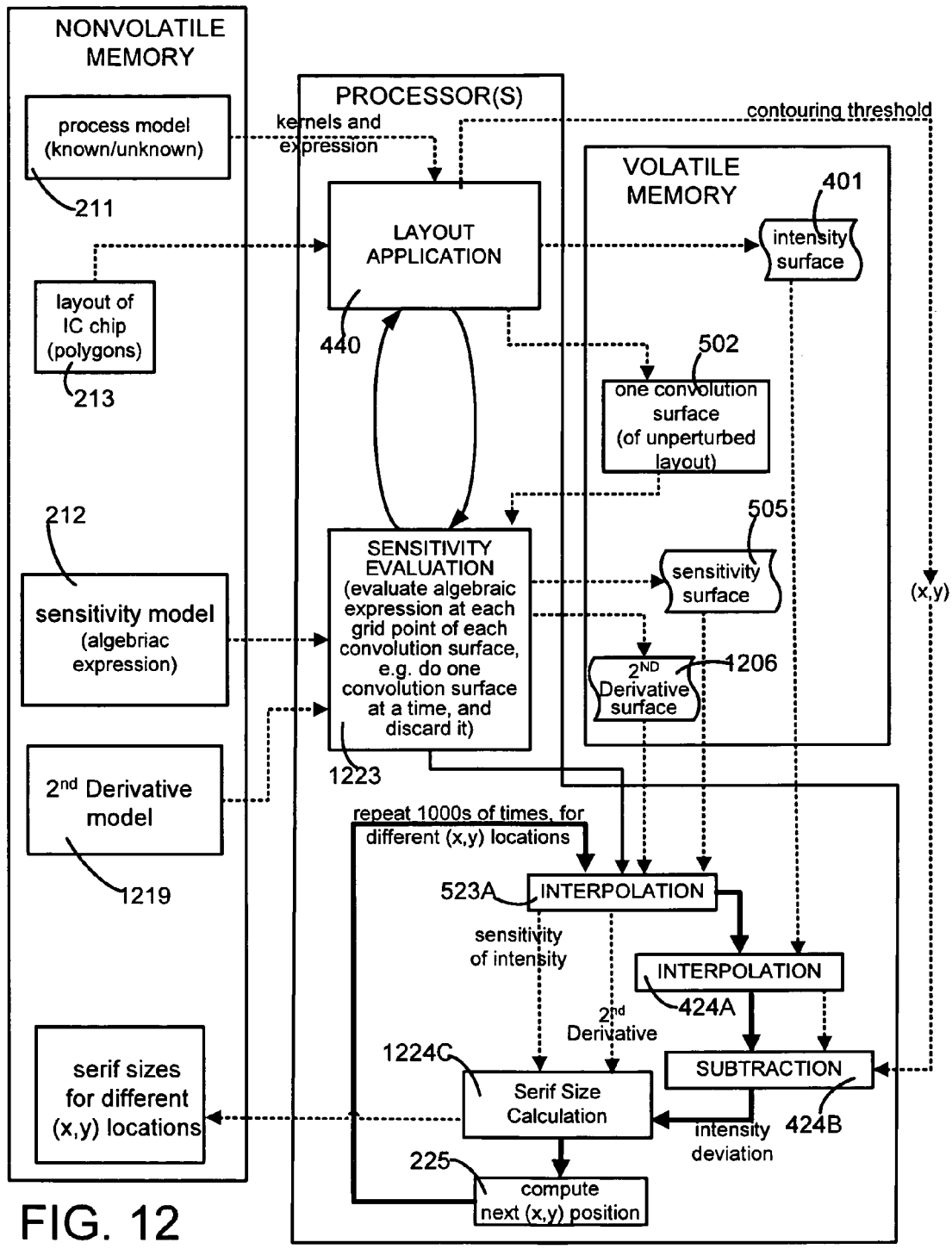
FIG. 12 illustrates additional variants of the type illustrated in FIG. 5B that generates both a sensitivity surface and a $2^{nd}$ derivative surface to improve the accuracy of the serif size calculation.

The sensitivity model can be extended to use the second derivative of the process model with respect to changes in the pattern. To derive the second derivative needed in the 2nd order expression, one can use the algebraic derivative method a second time, using the 1st derivative as input, and getting the 2nd derivative as output. In FIG. 12, a 2nd derivative model 1219 may be stored (in the non-volatile memory) separate from sensitivity model 212, or alternatively model 1219 may be stored as part of sensitivity model 212. In stage 1223 (which is similar to stage 223 discussed above), during sensitivity evaluation, the 2nd derivative model 1219 is also evaluated using any of the embodiments for the sensitivity evaluation that have already been discussed. The output of stage 1223 now includes an additional 2nd derivative surface 1206. Interpolation act 523A provides interpolated values for both the sensitivity surface and the 2nd derivative surface. In many typical models, the second derivative evaluates to a constant, wherein the 2nd derivative surface 1206 is replaced by a constant value, and the interpolation of the 2nd derivative in act 523A is not necessary. In this embodiment the calculation of serif area is no longer a simple division, but requires the solution to the quadratic equation 'b' listed in the previous paragraph, using the well known expression for solutions to quadratic equations:

$$Area(x, y) = \{-sensitivity(x, y) + sqrt(sensitivity(x, y)^2 + 2 * secondDerivative(x, y) * \text{Process Model Error})\} / (2 * \text{Process Model Error}).$$

The quadratic solution is performed in the Serif Size calculation act 1224C (which is otherwise similar or identical to division act 424C described above). This method is extended in some embodiments to higher order derivatives, to achieve any desired accuracy of the serif size calculation. For each higher order derivative in the process model, there is one additional model (e.g the $2^{nd}$ derivative model), one additional model evaluation in stage 1223, and one additional surface output from stage 1223 (e.g. the $2^{nd}$ derivative surface).

In such large-serif embodiments, when the process model is unknown, but the sensitivity model has been derived empirically, some embodiments use the empirically derived sensitivity expression 212E, plus the algebraic derivative method of subsection E, to derive the $2^{nd}$ derivative model.

Figure 9A:
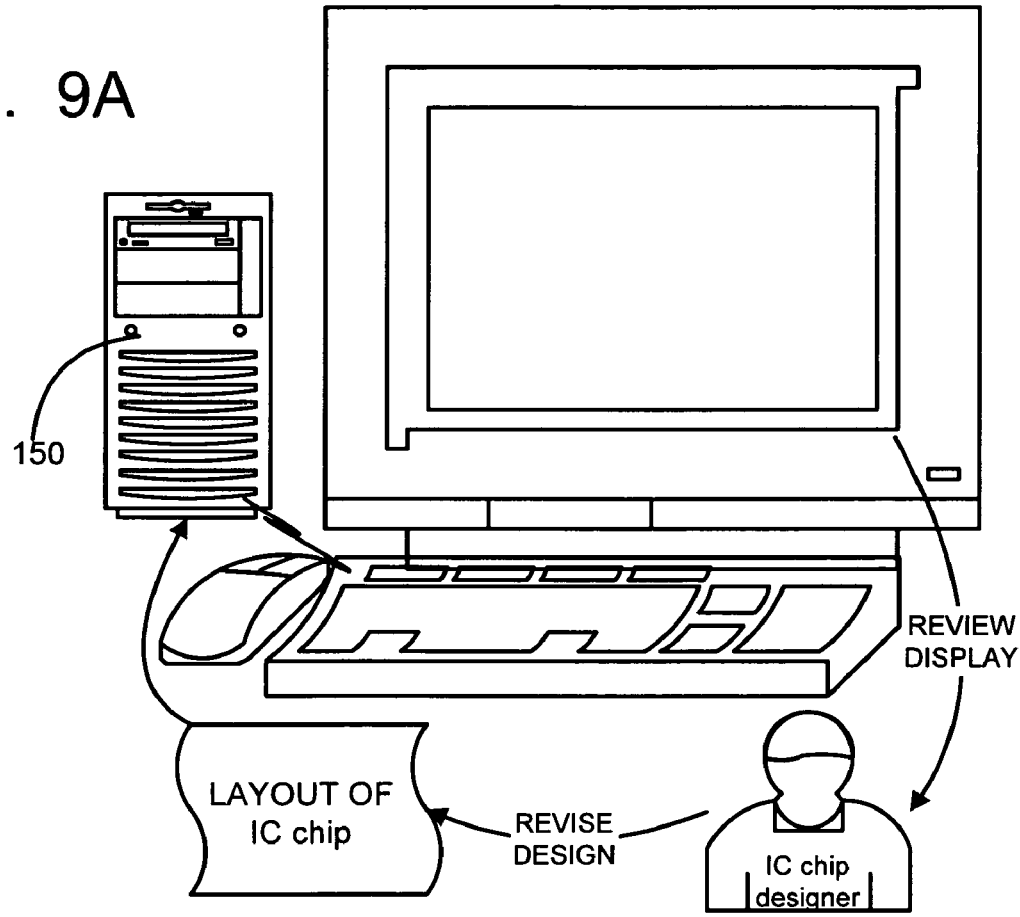
FIG. 9A illustrates, in a block diagram, a computer that is programmed in accordance with the invention.
Figure 9B:
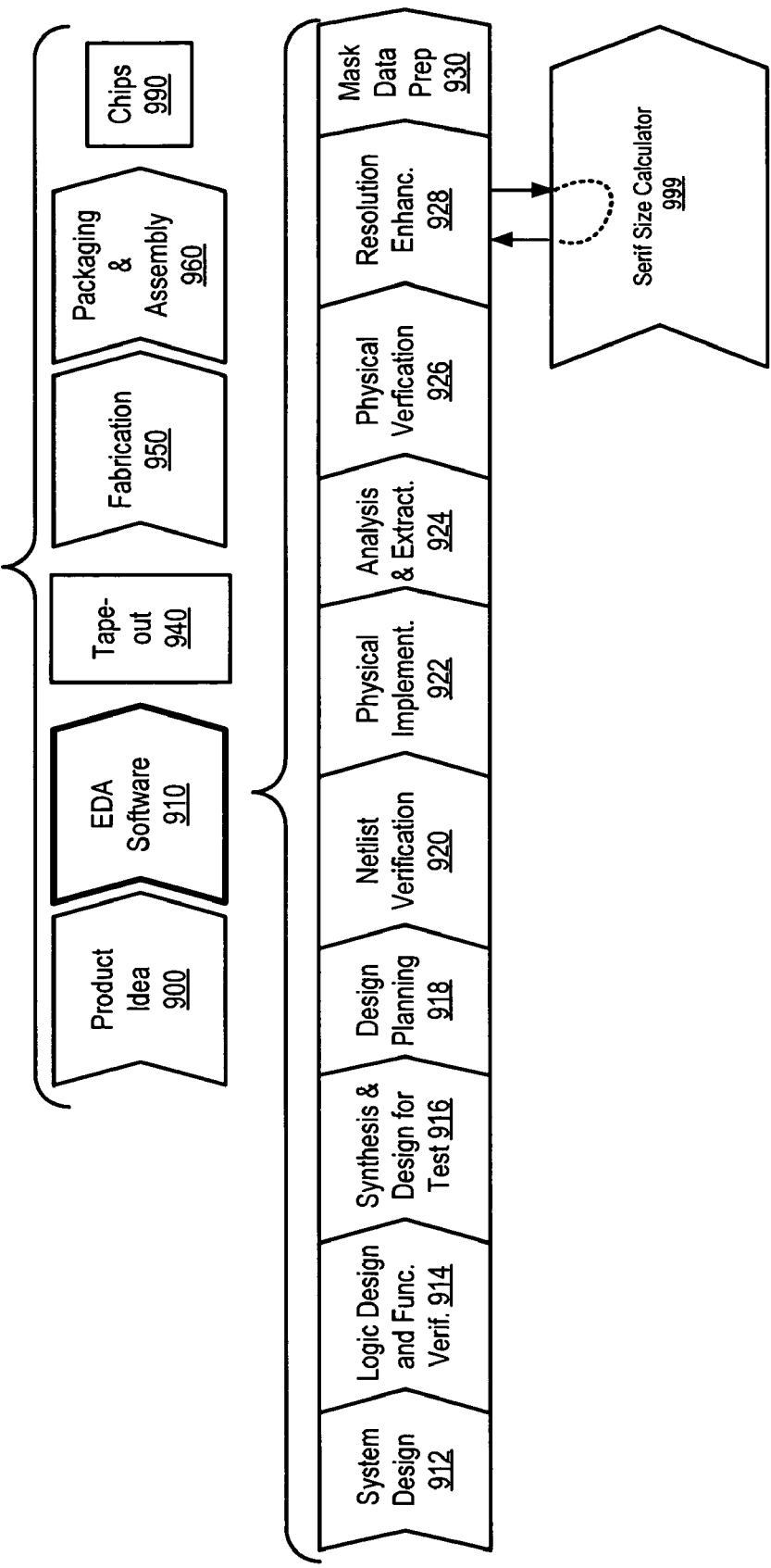
FIG. 9B illustrates, a simplified representation of an exemplary digital ASIC design flow in accordance with the invention.

Any proximity correction identifier of the type described above may be used in a digital ASIC design flow, which is illustrated in FIG. 9B in a simplified exemplary representation. At a high level, the process of designing a chip starts with the product idea (900) and is realized in a EDA software design process (910). When the design is finalized, it can be taped-out (event 940). After tape out, the fabrication process (950) and packaging and assembly processes (960) occur resulting, ultimately, in finished chips (result 990).

The EDA software design process (910) is actually composed of a number of stages 912-930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. More specifically, does the design as checked to ensure that produces the correct outputs. Exemplary EDA software products from Synopsys, Inc. that can be used at this stage include VCS, VERA, DesignWare®, Magellan, Formality, ESP and LEDA products.

Synthesis and design for test (stage 916): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 918): Here, an overall floorplan for the chip is constructed and analyzed for timing and top-level routing. Exemplary EDA software products from Synopsys, Inc. that can be used at this stage include Jupiter and Flooplan Compiler products.

Netlist verification (stage 920): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 922): The placement (positioning of circuit elements) and routing (connection of the same) occurs at this step. Exemplary EDA software products from Synopsys, Inc. that can be used at this stage include the Astro product. Although circuitry and portions thereof (such as rectangles) may be thought of at this stage as if they exist in the real world, it is to be understood that at this stage only a layout exists in a computer 150. The actual circuitry in the real world is created after this stage as discussed below.

Analysis and extraction (stage 924): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 926): At this stage various checking functions are performed to ensure correctness for: manufacturing, electrical issues, lithographic issues, and circuitry. Exemplary EDA software products from Synopsys, Inc. that can be used at this include the Hercules product.

Resolution enhancement (stage 928): This involves geometric manipulations of the layout to improve manufacturability of the design. Exemplary EDA software products from Synopsys, Inc. that can be used at this include iN-Phase, Proteus, and AFGen products. Note that the output of this stage 928 may be used in proximity correction identifier 999 as shown in FIG. 9B. Various embodiments of a proximity correction identifier 999 have been illustrated and described above in reference to FIG. 2 et seq. If the displayed results are not satisfactory, a chip designer may go back to stage 922 to make changes to the layout.

Mask data preparation (stage 930): This provides the "tape-out" data for production of masks for lithographic use to produce finished chips. Exemplary EDA software products from Synopsys, Inc. that can be used at this include the CATS(R) family of products. Note that proximity correction identifier 999 may also be used with the output of this stage 930. Actual circuitry in the real world is created after this stage, in a wafer fabrication facility (also called "fab").

The data structures and software code for implementing one or more acts described in this detailed description can be encoded into a computer-readable medium, which may be any storage medium and/or any transmission medium that can hold code and/or data for use by a computer. Storage medium includes, but is not limited to, magnetic and optical storage devices such as disk drives, magnetic tape, CDs (compact discs), and DVDs (digital versatile discs). Transmission medium (with or without a carrier wave upon which the signals are modulated) includes but is not limited to a wired or wireless communications network, such as the Internet. In one embodiment, the transmission medium uses a carrier wave that includes computer instruction signals for carrying out one or more steps performed by the methods illustrated in FIG. 2 et seq. In another embodiment, the transmission medium uses a carrier wave that includes a process model and a sensitivity model that both use the same kernels as illustrated in FIG. 2 et seq.

Note that a computer system used in some embodiments to implement a proximity correction identifier of the type described herein uses one or more linux operating system workstations (based on IBM-compatible PCs) and/or unix operating systems workstations (e.g. SUN Ultrasparc, HP PA-RISC, or equivalent), each containing a 2 GHz CPU and 1 GB memory, that are interconnected via a local area network (Ethernet), Numerous modifications and adaptations of the embodiments described herein will become apparent to the skilled artisan in view of this disclosure. For example, in some embodiments the known process model 211, in FIG. 3A, contains multiple models, describing the process behavior at multiple conditions in the process, such as defocus, different stepper exposures, etc. In such embodiments, the multiple process models are used to generate one or more sensitivity models. Moreover, in some embodiments, the two models in 211 and 212 are encapsulated in a single file or single data structure and supplied by a single supplier.

Some of the sensitivity model embodiments of FIGS. 3A and 3B included in this patent application cover a range of derivative relationships, such as sensitivity of intensity to the adding of or removing of a square serif, sensitivity of intensity to adding or removing of an infinite length and finite width serif, and the sensitivity of contour position (MEF) to both square and infinite length serif shapes. In other embodiments, the sensitivity to other types of pattern changes can be defined, such as sensitivity to a serif placed at some point other than the point (x,y) of evaluation, sensitivity to other serif shapes, sensitivity to groupings of multiple serifs, sensitivity to a some parameterized shape change to a predefined original polygon configuration, sensitivity to adding or removing serifs commonly called 'assist features' or 'scattering bars', and sensitivity to serifs added to contact masks to suppress the printing of extra contacts from optical sidelobes.

Also, as apparent from this patent application, in other embodiments, sensitivity model of FIGS. 3A and 3B can characterize the change in characteristics other than Intensity or Contour Position, such as the change in the convolution value calculated for any individual kernel; the change in any model expression that uses one or more kernel convolutions as arguments of the expression; the change in other intensity related characteristics such as the intensity gradient magnitude, intensity gradient direction, intensity maximum value within a predefined area, intensity minimum value within a predefined area, intensity surface derivatives of any order and direction, and an intensity error from a target value; the change in other contour position related characteristics such as contour curvature near corners, area enclosed within a contour, contour distance from some defined point, edge, or nearby contour, and separate and independent errors in contour position in two orthogonal directions such as x-axis and y-axis; and the change in the contouring threshold value.

It is further apparent that in some embodiments, the sensitivity model 212, in FIG. 2, can be substituted back into model 211, and any embodiment of the method for creating the sensitivity model from 211 can be repeated iteratively to create sensitivity derivatives of higher order, such as second and third derivatives. It is also apparent in FIG. 2 that the sensitivity evaluation in 223 is a first order estimation if the sensitivity model 212 models only the first derivative of expression 211E. However, the sensitivity evaluation in 223 can achieve any desired precision, by adding higher order derivatives of expression 211E to the sensitivity model.

In some embodiments, the xy loop that repeats 1000's of times in FIG. 2, efficiently calculates and stores other characteristics at each (x,y) point, and that serif size (for a square serif) or serif width (for an infinite length serif), are just two examples. Other examples of characteristics that can be efficiently calculated and stored in memory 250, that use a sensitivity model and the distorted layout as inputs include, sensitivity to defocus, sensitivity to exposure variations, range of acceptable defocus variations at that (x,y) point, range of acceptable exposure variations at that (x,y) point, estimation of the proportion imaged features (yield) that meet a predefined criteria for acceptable shape and/or other process characteristics. It is also apparent that in FIG. 2, the original layout 262 of the IC chip of some embodiments can include a layout that already includes serifs resulting from one or more previous reticle enhancement technology steps, including proximity correction, addition of assist features, or phase shift mask phase assignment.

It is apparent that for an unknown process model in FIG. 3B, where the kernels are known, but the expression 211E is unknown, that the expression 211E can be empirically determined, either exactly or as an approximation using a general expansion such as a Taylor series. One such embodiment that uses a test pattern and regression fitting has been discussed above. But other embodiments treat the process model evaluation stage 322B as a black box, and empirically characterize the behavior of the black box. Such embodiments may directly modify the shapes of the convolution kernels, or directly overwrite the convolution surface inputs to the black box. A systematic choice of modifications to the kernel shapes or directly overwriting the convolution surface inputs, while recording the output of stage 322B, efficiently and accurately derives the fit coefficients to determine both the form and coefficients of expression 211E. It is further apparent that if the unknown expression 211E in FIG. 3A can made known by any of a number of embodiments, then the sensitivity model 212 can be derived algebraically from the empirically determined process model expression 211E.

It is apparent that the methods to empirically determine the process model expression 211E, can be modified to empirically determine the derivatives of the process model directly, without explicit determination of the process model expression 211E. The methods to evaluate the behavior of 322B need only be modified to record the change in the output of 322B (its partial derivative) with respect to some small perturbation in the convolution surface values. If the perturbation in the convolution surface values is chosen to mimic the addition of a small square serif, or an infinite serif of finite width, then the sensitivity model 212 can be empirically determined directly from the output of 322B, without ever knowing the process model expression 211E, and without the use of a test pattern.

It is also apparent in FIG. 5B, that the loop that efficiently calculates the process model in 440, and the sensitivity model in 223, can also include more than one process model, more than one sensitivity model, and one or more higher derivative models, where the output of the loop will be 'P' surfaces, one for each of 'P' expressions corresponding to 'P' total models. And the 'P' surfaces can all be used in the xy loop to calculate any number of pattern layout and/or process characteristics.

These embodiments that are apparent from paragraphs [0124]-[0131] exhibit some or all of the advantages common to FIG. 2 as follows. First, all sensitivity models are based on the process models' kernels and corresponding unperturbed convolution results. Hence, there is no need to calculate the effect of the perturbation on each of the individual convolutions used in the process models (e.g. a second application of the process models). Second, the sensitivity models will be at least one order of complexity simpler than the process model, and easier to compute. Third, since it is not necessary to calculate perturbed convolution surface results, it is not a requirement that one save, modify, or regenerate the intermediate convolution results, thereby reducing memory requirements.

Numerous modifications and adaptations of the embodiments described herein are encompassed by the scope of the invention. The following subsections contain illustrative exemplary directions to humans and/or pseudo-code for the evaluation of a process model that occurs in FIG. 2, number 240: SUBSECTION A—Methods to evaluate a Process Model, SUBSECTION B—Creation of a convolution surface by FFT, SUBSECTION C—Creation of a convolution surface by Space Domain Integration, SUBSECTION D—One embodiment to empirically determine the derivative of an unknown process model and SUBSECTION E—One embodiment to algebraically determine the derivative of a known process model. Each of these subsections A-E is an integral portion of this detailed description section of this patent application, and is incorporated by reference herein in its entirety.

SUBSECTION A: Methods to evaluate a Process Model Given as inputs: A) N kernels, B) IC Layout Data for a single process layer (typically will be for some portion of the IC design, such as a 100 um square area.) Produce as outputs: C) N convolution surfaces, one for each kernel, D) An intensity surface, E) A contouring threshold value which may vary with (x,y) position, and F) An optional set of distorted contours calculated from D & E. Step 1: Choose a grid size for the convolution surface, where the spacing between gridpoints is ~½ the minimum size of the IC design. Step 2: Create an array to hold the intensity surface, of the same grid size.

Step 3: For n=0 to N 'for each of N kernels:
   a. Create a convolution surface by the method of appendix B or C or any other method of convolution.
   b. Save each convolution surface
Step 4: Next n.
Step 5: For each grid point in the convolution surfaces
   c. Evaluate the process model expression 211E and save the result into the corresponding grid point of the intensity surface.
     i. Method of an API fiction: If expression 211E is provided as a function with an API, call this function, using the convolution values at that grid point as inputs, and getting the intensity value at that grid point as output.
     ii. Method of a known expression 211E: Parse expression 211E; Evaluate the expression at this grid point, using the convolution values as inputs, and getting the intensity value as output.
     iii. A specific example where the intensity is the sum of squares of the convolution surfaces.
       1. Intensity value=0;
       2. For n=1 to N 'for N convolution surfaces
         a. gridValue=surface 'n' at xy grid point.
         b. Intensity value=Intensity Value+gridValue^2.
       3. Next n 'next convolution surface.
Step 6: Next xy grid point.

SUBSECTION B: Creation of a convolution surface by FFT.
   STEP 1. Do a forward FFT on the IC Layout (need to do this only once for all Kernels)
   STEP 2. Do a forward FFT on the Kernel.
   STEP 3. For each point in the transformed IC layout:
     a. Layout value=IC layout value*Kernel value
   STEP 4. Next point in transformed IC layout.
   STEP 5. Do an inverse FFT on the IC layout.

The result is the convolution surface which is stored and used in SUBSECTION A. Any commercially-available FFT software may be used to implement the FFT in steps 1, 2, and 5. Such FFT functions are supplied in the software package MATHEMATICA available from Wolfram Research, Inc., 100 Trade Center Drive, Champaign, Ill. as well as in the software package MATHCAD available from Mathsoft Engineering & Education, Inc. 101 Main Street, Cambridge, Mass. A description of a two-dimensional FFT, including usable C-code, can be found in "Numerical Recipes in C", by William Press, Cambridge University Press, 2002, pages 521-525.

SUBSECTION C: Creation of a convolution surface by Space Domain Integration. For each xy point in the grid, Evaluate the convolution using the method of U.S. Pat. No. 6,289,499 "Proximity Correction Software for wafer lithography". This method integrates the convolution kernel and the IC layout at a given xy point, using a fast space domain calculation. Increment to next point in transformed IC layout. The result is the convolution surface which is stored and used in SUBSECTION A.

SUBSECTION D: One embodiment to empirically determine the derivative of an unknown process model.
1. Create a test pattern from one of the following two methods.
   a. Choose one or any number of real IC designs intended to be manufactured on that process. Choose those polygon layers that correspond to the process model layer.
   b. Design a single layer test pattern that includes a range of polygon shapes and sizes that are representative of all designs, for that given process and layer.
2. On the test pattern, define a representative set of (x,y) positions with either of the two approaches:
   a. Preferred approach: Use a simple sampling grid where the sample points are evenly spaced in x and y. (This grid need not correspond to the grid used for any internal FFT).
   b. Pick sample points near or along the edges of polygons, where the sensitivity model will be used in real OPC applications. This includes edges of lines, near corners, and at line ends. For example, use Proteus available from Synopsys, Inc. to break the polygons into edges, corners, and line-ends, and output a list of (x,y) locations.
3. Create a two dimensional data structure to store the (x,y) positions. This structure has two columns for x and y, and M rows for M representative positions.
4. Initialize the following data structure to have M rows, where M is the number of (x,y) sample positions, and N+1 columns where N is the number of Kernels in the process model:

Convolution1(x,y) . . . ConvolutionN(x,y), Signal (x,y)

5. For each of M (x,y) positions, evaluate the process model using any of the computational methods of appendix A. Evaluation of the Process Model receives as input the test pattern, N known kernels, and a process model (known or unknown). Outputs are an intensity value at (x,y), and N convolution values at (x,y), one for each of N kernels. At each (x,y) position, save the signal(x,y) and the convolution values, until the data structure in step 3 has been filled with data.
6. Add two columns to the data structure in 'step 4': which stores a 'perturbed signal', and a 'delta signal'.

Con.1(x,y), . . . Con.N(x,y), Signal (x,y), Perturbed-Sig.(x,y), DeltaSig.(x,y)

7. Define a small square serif to 'perturb' the original pattern. The area of the serif is small, on order of 1/10 of the area of the minimum contact or via size used in the process.
8. For every (x,y) point in the datastructure of Step 2: place the small serif, centered at the (x,y) sample point. Recalculate a 'perturbed' signal value at this single point using any of the evaluation methods in appendix A. It will not be necessary to save the N perturbed convolution values. Save the perturbed signal value in the data structure of step 6.
9. In the data structure of step 6, for each of M rows corresponding to M (x,y) positions, calculate the delta signal value as the perturbed signal minus the original (unperturbed) signal. The columns of data for Signal(x, y) and PerturbedSignal(x,y) may be optionally removed from the data structure at this time.

10. Using known statistical fitting tools, fit the value of 'Delta Signal', using Convolution_1 through Convolution_N as dependent variables. A linear regression fit is sufficient for typical original models.

11. Save the coefficients used for the fit into a separate model file. The perturbation model may look like this in its simplest form:

Delta_Signal_per_small_square_area=c0+
    c1*convolution_1+ . . .

12. Normalize the perturbation model expression by dividing each coefficient by the area of the small square pattern used to perturb the model. (e.g. C0=c0/area_of_small_square.) Now the sensitivity model is in a desired form:

Delta_Signal_per_unit_area=C0+C1*convolution_1+
    . . .

The results of the methods described by steps 1-12 is the sensitivity model 212. To fit higher order expressions 212E, the data structure in step 6 can be expanded to include N additional second order, terms such as Convolution1^2, through ConvolutionN^2. Additional cross terms such as 'Convolution1*Convolution2', or even higher order cubic terms may be added. In step 10, the linear regression fit calculates an additional high order coefficient for each additional column that was added in step 6.

SUBSECTION E: One embodiment to algebraically determine the derivative of a known process model 1. For each kernel in the process model, define a corresponding constant called the 'Kernel Center Value', as shown in FIGS. 10B and 11B. The constant is set equal to the value of the kernel at the center (r=0) coordinate. For many typical kernels such as those shown in FIG. 1F through 1O, the kernel center value is zero.

2. The process model expression 211E is known. For example in the common case of a 'sum of squares' process model, expression 212E represents:

$$Intensity(x, y) = [(K0 \text{ convolved } IC \text{ Layout})|_{x,y}]^{\wedge}2 +$$
$$[(K1 \text{ convolved } IC \text{ Layout})|_{x,y}]^{\wedge}2 + \ldots +$$
$$[(KN \text{ convolved } IC \text{ Layout})|_{x,y}]^{\wedge}2$$

Where $|_{x,y}$ means the result of the convolution is evaluated at point (x,y). Replace all of the terms where a Kernel is convolved with the IC Layout with variables X1 through XN.

$$Intensity(x,y)=[X1]^{\wedge}2+[X2]^{\wedge}2+\ldots+[XN]^{\wedge}2$$

3. Using the well known rules of differentiation, differentiate intensity with respect to the variables X1, X2, . . . XN.

$$\partial Intensity(x,y)=2*X1*\partial X1+2*X2*\partial X2+\ldots + 2*XN*\partial XN$$

4. Partial derivative terms ∂X1 through ∂XN represent the partial derivative of a convolution operation (Kernel_n convolved with the IC Layout)$|_{x,y}$ with respect to changes in the IC Layout, where the change in the IC layout is the addition of a small square perturbation at coordinate (x,y). This partial derivative evaluates to the 'Center Kernel Value' described in step 1. For many kernels, such as those shown in FIG. 1F-!O, this partial derivative and the 'Kernel Center Value' is zero. The corresponding terms for these kernels drop out of the sensitivity expression. Back substitute the 'Kernel Center Value' for ∂X1 through ∂XN.

$$\partial Intensity(x, y) = +2*X1*KernelCenterValue1 +$$
$$2*X2*KernelCenterValue2 + \ldots + 2*XN*KernelCenterValue3$$

5. Back substitute the variables X1 through Xn with the original convolution operations:

$$\partial Intensity(x, y) =$$
$$2*KernelCenterValue1*(K1 \text{ convolved } IC \text{ Layout})|_{x,y} +2*$$
$$KernelCenterValue2*(K2 \text{ convolved } IC \text{ Layout})|_{x,y} +\ldots +$$
$$2*KernelCenterValueN*(KN \text{ convolved } IC \text{ Layout})|_{x,y}$$

6. The equation in step 5 is the sensitivity model 212. To use this expression during evaluation of the sensitivity model in stage 223, replace the convolution operation with the pre-calculated convolution surfaces 402.

$$\partial Intensity(x, y) \text{ per unit change in serif area} =$$
$$2*KernelCenterValue1*Surface1|_{x,y} +2*KernelCenterValue2*$$
$$Surface2|_{x,y} +\ldots + 2*KernelCenterValueN*SurfaceN|_{x,y}$$

This algebraic derivative method, steps 1-6, works for any arbitary known expression 211E, and the result is the sensitivity model 212. To evaluate the sensitivity model in 223, the only required inputs are the expression 212E, and the N convolution surfaces provided by 240. Several embodiments use commercially available software tools to automatically calculate the derivative in step 3 using symbolic math, including MATHEMATICA available from Wolfram Research, Inc., 100 Trade Center Drive, Champaign, Ill. as well as MATHCAD available from Mathsoft Engineering & Education, Inc. 101 Main Street, Cambridge, Mass.

What is claimed is:

1. A computer-implemented method of proximity correction of an original layout of an integrated circuit chip in a semiconductor wafer for use with a semiconductor wafer fabrication process, the method comprising:

applying a first model of a plurality of acts in the process, to at least one location of the original layout, to obtain a distorted layout representing a manufactured shape resulting from the process;

wherein the first model comprises a plurality of kernels and an expression using the plurality of kernels;

wherein the applying generates a plurality of surfaces equal in number to the plurality of kernels in the first model;

wherein each surface comprises values representing results of convolution of the plurality of kernels with the original layout, at a plurality of locations in the original layout;

evaluating a second model, of sensitivity of the distorted layout with respect to a change in the original layout, using said values from the plurality of surfaces at said one location, thereby to obtain a sensitivity value at said one location; and determining a proximity correction to be made to the original layout at said one location, based on at least the sensitivity value and the distorted layout resulting from evaluating the first model.

2. The method of claim 1 wherein:
the first model comprises an expression, for using values in the plurality of surfaces; and
the second model comprises a derivative of the expression.

3. The method of claim 2 wherein:
the expression in the first model is known;
the derivative is a result of differentiating the expression in the first model.

4. The method of claim 2 wherein:
at least one constant in the expression in the first model is unknown;
a function for evaluation of the expression in the first model, at each given location, is available for invocation; and
the function is repeatedly invoked to obtain a plurality of values of sensitivity at a corresponding plurality of locations; and
the plurality of values of sensitivity are fitted to an expression of values in the plurality of surfaces.

5. The method of claim 1 wherein the convolving comprises:
transforming the layout into a frequency domain, to obtain a transform;
transforming each kernel in the plurality of kernels, into the frequency domain, to obtain transforms;
multiplying the transforms of each kernel with the transform of the layout, to obtain a plurality of scaled transforms equal in number to the plurality of kernels; and
inverting each scaled transform, to obtain a surface comprising results of convolution.

6. The method of claim 1 wherein the change in layout comprises:
a predetermined shape of a predetermined size.

7. The method of claim 1 wherein the change in layout comprises:
a rectangle of
a predetermined width.

8. The method of claim 1 wherein the change in layout comprises:
a movement of a contour in the layout.

9. The method of claim 1 wherein the first model is one of a plurality of first models and the second model is one of a plurality of second models, the method further comprising:
repeating said evaluating of first model with an additional first model in the plurality of first models; and
repeating said evaluating of second model with an additional second model in the plurality of second models.

10. The method of claim 1 further comprising:
evaluating a $2^{nd}$ derivative model, of rate of change of the sensitivity model with respect to the change in the original layout;
wherein said determining uses a value of the rate of change from evaluating the $2^{nd}$ derivative model.

11. A computer-readable medium encoded with computer instructions to perform the method of claim 1.

12. A storage medium comprising:
a first expression that models a semiconductor wafer fabrication process, when applied to an original layout to generate as output a distorted layout, the first expression being based on a plurality of kernels;
a second expression that models sensitivity of the distorted layout with respect to a change in the original layout, the second expression being based on said plurality of kernels; and
a plurality of computer instructions to evaluate each of the first expression and the second expression and use values from evaluation to identify proximity corrections for a layout of an integrated circuit chip.

13. The storage medium of claim 12 wherein:
the second expression is a derivative of the first expression.

14. The storage medium of claim 12 wherein:
the second expression approximates a derivative of the first expression.

15. A computer-inplemented apparatus for identifying a plurality of proximity corrections for a layout of an integrated circuit chip, the apparatus comprising:
a memory encoded with a first model of a semiconductor wafer fabrication process, with an original layout as input and a distorted layout as output, the first model comprising a first expression based on a plurality of kernels and a second model of sensitivity of the distorted layout with respect to a change in the original layout, the second model comprising a second expression based on said plurality of kernels;
first means, coupled to said memory, for evaluating the first model; and
second means, coupled to said memory, for evaluating the second model based on results of convolution of the plurality of kernels with the original layout; and
third means, coupled to said first means and said second means, for determining said plurality of proximity corrections, based on results of evaluation of the first model and results of evaluation of the second model.

16. The apparatus of claim 15 further comprising:
fourth means, coupled to said memory, for computing the results of convolution;
wherein the fourth means is coupled to the second means to supply thereto said results of convolution.

17. The apparatus of claim 15 further comprising:
fourth means, coupled to said memory, for computing the results of convolution;
wherein the fourth means is coupled to each of the first means and the second means, to supply thereto said results of convolution 18. A storage medium comprising:
a plurality of intensity values indicative of a distorted layout;
a plurality of first instructions for evaluating a first expression that models a semiconductor wafer fabrication process to generate said plurality of intensity values;
wherein the first expression is based on a plurality of kernels;
a plurality of sensitivity values indicative of sensitivity of the distorted layout to changes in the original layout;
a plurality of second instructions for evaluating a second expression based on said plurality of kernels to generate the plurality of sensitivity values.

19. The storage medium of claim 18 further comprising:
a set of convolution values obtained by convolution of said original layout with at least one kernel in said plurality of kernels.

20. The storage medium of claim 18 further comprising:
a plurality of computer instructions to evaluate each of the first expression and the second expression and store values from evaluation.

21. The storage medium of claim 18 further comprising:
a plurality of computer instructions to use the plurality of intensity values and the plurality of sensitivity values, in a loop with at least one iteration for each location in a plurality of locations (x,y), to identify proximity corrections for a layout of an integrated circuit chip.

22. A method of proximity correction of an original layout of an integrated circuit chip in a semiconductor wafer for use with a wafer fabrication process, the method comprising:
using a model of the wafer fabrication process to create a model of sensitivity of a distorted layout with respect to a change in the original layout;
wherein the distorted layout is obtained by evaluating the model of wafer fabrication process and the distorted layout represents a manufactured shape that results from performing the wafer fabrication process using the original layout;
automatically evaluating the model of sensitivity, to obtain a sensitivity value at each of a plurality of locations in the original layout; and
automatically determining a proximity correction to be made to the original layout in at least one location of the original layout, based on at least the sensitivity value and based on a difference between the distorted layout and the original layout in said at least one location.

23. The method of claim 22 wherein:
the act of using is performed automatically.

24. The method of claim 22 wherein:
the act of using is performed at least in part manually.

* * * * *